United States Patent
Yoon et al.

(10) Patent No.: US 9,799,674 B2
(45) Date of Patent: Oct. 24, 2017

(54) SEMICONDUCTOR DEVICES INCLUDING FIELD EFFECT TRANSISTORS

(71) Applicant: SAMSUNG ELECTRONICS CO., LTD., Suwon-si, Gyeonggi-do (KR)

(72) Inventors: Changseop Yoon, Yangsan-si (KR); Junggun You, Ansan-si (KR); YoungJoon Park, Seoul (KR); Jeonghyo Lee, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/050,607

(22) Filed: Feb. 23, 2016

(65) Prior Publication Data
US 2016/0284680 A1    Sep. 29, 2016

(30) Foreign Application Priority Data
Mar. 27, 2015  (KR) ................ 10-2015-0043087

(51) Int. Cl.
| | | |
|---|---|---|
| H01L 21/70 | (2006.01) | |
| H01L 21/336 | (2006.01) | |
| H01L 27/118 | (2006.01) | |
| H01L 29/78 | (2006.01) | |
| H01L 29/423 | (2006.01) | |
| H01L 29/66 | (2006.01) | |
| H01L 29/06 | (2006.01) | |
| H01L 21/762 | (2006.01) | |

(52) U.S. Cl.
CPC ...... *H01L 27/118* (2013.01); *H01L 21/76224* (2013.01); *H01L 29/0653* (2013.01); *H01L 29/4236* (2013.01); *H01L 29/42376* (2013.01); *H01L 29/66621* (2013.01); *H01L 29/66659* (2013.01); *H01L 29/7846* (2013.01); *H01L 29/0673* (2013.01)

(58) Field of Classification Search
CPC .................. H01L 29/7846; H01L 29/0653
USPC .................. 257/374; 438/196, 295, 454
See application file for complete search history.

(56) References Cited

U.S. PATENT DOCUMENTS

| | | | |
|---|---|---|---|
| 8,653,608 B2 | 2/2014 | Lee et al. | |
| 8,659,097 B2 | 2/2014 | Mor et al. | |
| 8,686,496 B2 * | 4/2014 | Mikasa | ............ H01L 27/10814 257/331 |
| 8,766,364 B2 | 7/2014 | Doornbos et al. | |
| 8,835,268 B2 | 9/2014 | Sudo | |
| 8,928,057 B2 | 1/2015 | Cote et al. | |

(Continued)

*Primary Examiner* — Calvin Lee
(74) *Attorney, Agent, or Firm* — Lee & Morse P.C.

(57) ABSTRACT

A semiconductor device includes a first device isolation layer defining active regions spaced apart from each other along a first direction on a substrate, second device isolation layers defining a plurality of active patterns protruding from the substrate, the second device isolation layers extending in the first direction to be spaced apart from each other in a second direction and connected to the first device isolation layer, a gate structure extending in the second direction on the first device isolation layer between the active regions, a top surface of the second device isolation layer being lower than a top surface of the active pattern, a top surface of the first device isolation layer being higher than the top surface of the active pattern, and at least part of a bottom surface of the gate structure being higher than the top surface of the active pattern.

25 Claims, 24 Drawing Sheets

(56) References Cited

U.S. PATENT DOCUMENTS

| | | |
|---|---|---|
| 8,928,093 B2 | 1/2015 | Lo et al. |
| 8,956,942 B2 | 2/2015 | Loubet et al. |
| 8,969,974 B2 | 3/2015 | Liaw |
| 9,041,115 B2 | 5/2015 | Liaw |
| 9,041,125 B2 | 5/2015 | Lin et al. |
| 2012/0214297 A1* | 8/2012 | Cho .................. H01L 29/4236 438/586 |
| 2014/0061742 A1* | 3/2014 | Nishitani .......... H01L 27/10814 257/296 |
| 2014/0117454 A1 | 5/2014 | Liu et al. |

* cited by examiner

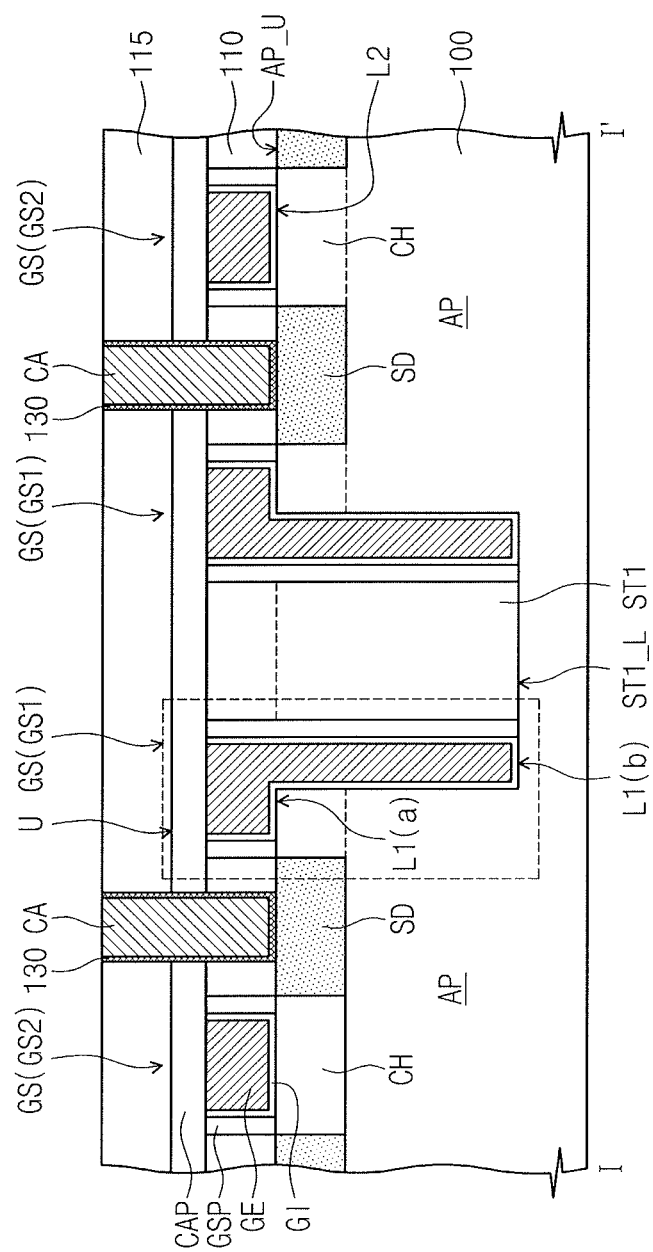

3000

4000

SEMICONDUCTOR DEVICES INCLUDING FIELD EFFECT TRANSISTORS

CROSS-REFERENCE TO RELATED APPLICATION

Korean Patent Application No. 10-2015-0043087, filed on Mar. 27, 2015, in the Korean Intellectual Property Office, and entitled: "Semiconductor Devices Include Field Effect Transistors," is incorporated by reference herein in its entirety.

BACKGROUND

1. Field

Embodiments relate to a semiconductor device, and more particularly, to a semiconductor device including a plurality of logic cells.

2. Description of the Related Art

Due to miniaturization, multifunction, and/or low manufacturing cost, a semiconductor device is being spotlighted as an important factor in an electronic industry. Semiconductor devices may be classified into semiconductor memory devices storing logical data, semiconductor logical devices performing operation processes of logical data, and hybrid semiconductor devices including a memory element and a logical element. As an electronic industry highly develops, requirements for characteristics of a semiconductor device are gradually increasing. For example, requirements for high reliability, high speed and/or multifunction with respect to a semiconductor device are gradually increasing. To satisfy those requirements, structures of the semiconductor device become more complicate and the semiconductor device is also being highly integrated.

SUMMARY

Example embodiments provide a semiconductor device having excellent reliability and a method of manufacturing the same.

Other example embodiments provide a semiconductor device having a variety of characteristics and a method of manufacturing the same.

According to embodiments, there is provided a semiconductor device including a first device isolation layer defining active regions spaced apart from each other in a first direction on s substrate; second device isolation layers defining a plurality of active patterns protruded from the substrate in each active region, extending in the first direction and being arranged in a second direction across the first direction to be connected to the first device isolation layer; and a gate structure extending in the second direction and being provided on the first device isolation layer between the active regions. A top surface of the second device isolation layer is located lower level than a top surface of the active pattern, and a top surface of the first device isolation layer is located higher level than the top surface of the active pattern. At least a part of a bottom surface of the gate structure is located higher level than the top surface of the active pattern.

At least the part of the bottom surface of the gate structure may contact the top surface of the first device isolation layer.

The gate structure may be spaced apart from the active patterns and the bottom surface of the gate structure contacts the top surface of the first device isolation layer.

The part of the bottom surface of the gate structure may contact end portions of the active patterns spaced apart from each other in the second direction and the other part of the bottom surface of the gate structure contacts the top surface of the first device isolation layer.

The gate structure may include a gate electrode extending in the second direction and a gate insulating pattern extending along a bottom surface of the gate electrode. The gate electrode may include a conductive material.

At least a part of a bottom surface of the gate insulating pattern may contact the top surface of the first device isolation layer.

The gate structure may be a first gate structure. The semiconductor device according to the embodiments may further include second gate structures extending in the second direction and being provided on the active regions, wherein the second gate structures are arranged to cross the active patterns spaced apart from each other.

The semiconductor device according to the embodiments may further include source/drain regions provided in the active patterns at both sides of each of the second gate structures. The first gate structure is electrically insulated from adjacent source/drain regions by the first device isolation layer.

The semiconductor device according to the embodiments may further include a first logic cell and a second logic cell adjacent to each other in the second direction. The first device isolation layer defines the active regions in the first logic cell. The gate structure extends in the second direction crossing the active patterns of the second logic cell.

The semiconductor device according to the embodiments may further include source/drain region provided in a part of the active pattern of the second logic cell at both sides of the gate structure. The other part of the active pattern which is located under the gate structure in the second logic cell is used as a channel region.

According to other embodiments, there is provided a semiconductor device including a first device isolation layer defining active regions spaced apart from each other extending a first direction on the substrate; second device isolation layers defining active patterns protruded from the substrate in each active region, extending in the first direction and being arranged in a second direction across the first direction to be connected to the first device isolation layer; and a gate structure extending in the second direction and penetrating the first device isolation layer between the active regions. At least a part of a bottom surface of the gate structure contacts a bottom surface of the first device isolation layer.

A top surface of the gate structure may be located at higher level than top surfaces of the active patterns.

A top surface of the second device isolation layer may be located at lower level than the top surfaces of the active patterns.

The gate structure is spaced apart from the active patterns and the bottom surface of the gate structure may contact the bottom surface of the first device isolation layer.

A part of the bottom surface of the gate structure may contact end portions of the active patterns spaced apart from each other in the second direction.

The gate structure may include a gate electrode extending in the second direction and a gate insulating pattern extending along a bottom surface of the gate electrode. The gate electrode may include a conductive material.

At least a part of a bottom surface of the gate insulating pattern may contact the bottom surface of the first device isolation layer.

The gate structure may be a first gate structure. The semiconductor device according to the embodiments may further include second gate structures extending in the second direction and being provided on the active regions, wherein each of the second gate structures cross the active patterns spaced apart from each other.

The semiconductor device according to the embodiments may further include source/drain regions provided in the active patterns at both sides of each of the second gate structures. The first gate structure is electrically insulated from adjacent source/drain regions by the first device isolation layer.

The semiconductor device according to the embodiments may further include a first logic cell and a second logic cell adjacent to each other in the second direction. The first device isolation layer defines the active regions in the first logic cell. The gate structure extends in the second direction crossing the active patterns of the second logic cell.

According to yet other embodiments, there is provided a semiconductor device including a first device isolation layer defining active regions spaced apart from each other along a first direction on a substrate, second device isolation layers defining a plurality of active patterns protruding from the substrate in each active region, the second device isolation layers extending in the first direction to be spaced apart from each other in a second direction crossing the first direction to be connected to the first device isolation layer, and a gate structure extending in the second direction on the first device isolation layer between the active regions, a bottom surface of the first device isolation layer being wider than a bottom surface of the gate structure, and at least a portion of the first device isolation layer separating the bottom surface of the gate structure from an adjacent active pattern.

At least a first part of the bottom surface of the gate structure may be at a higher level than a top surface of the active pattern.

At least the first part of the bottom surface of the gate structure may directly contact an uppermost surface of the first device isolation layer.

The uppermost surface of the first device isolation layer may be wider than the bottom surface of the first device isolation layer.

At least a first part of the bottom surface of the gate structure may contact the bottom surface of the first device isolation layer.

BRIEF DESCRIPTION OF THE DRAWINGS

Features will become apparent to those of skill in the art by describing in detail exemplary embodiments with reference to the attached drawings, in which:

FIGS. 13A and 13B illustrate cross-sectional views along lines I-I' and II-II' of FIG. 12, respectively.

DETAILED DESCRIPTION

Figure 1:
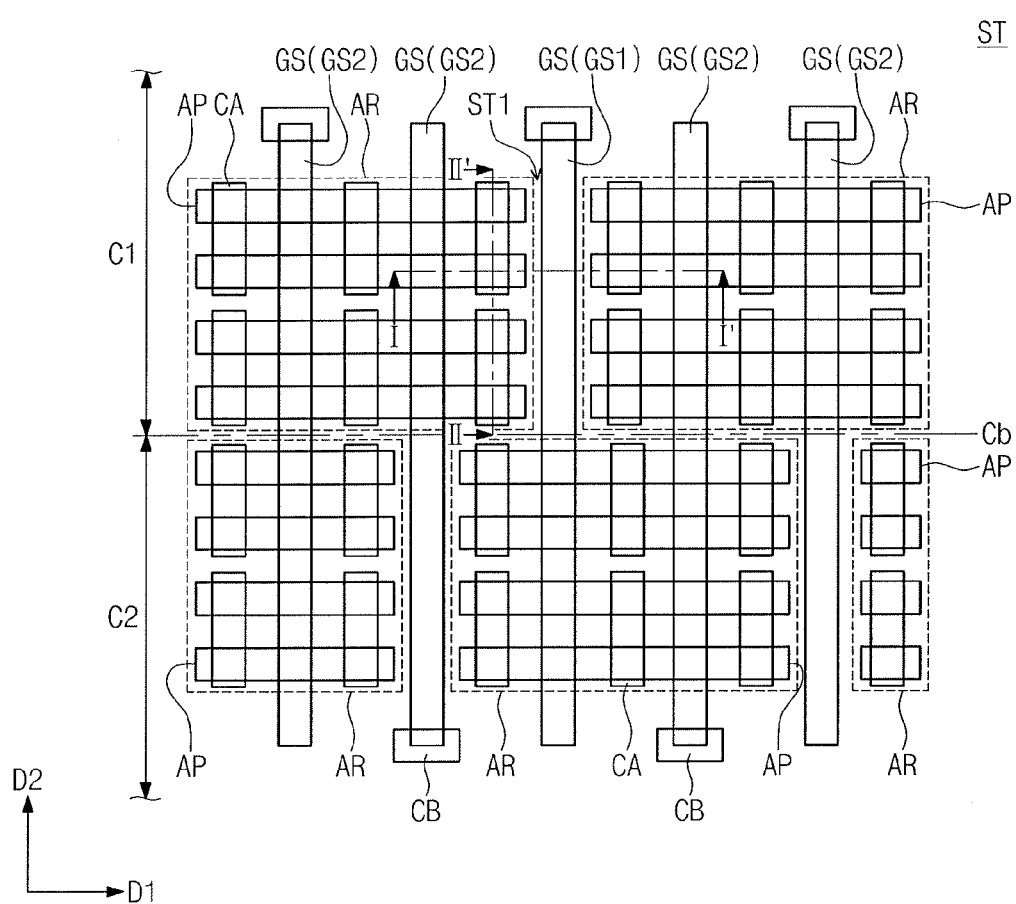
FIG. 1 illustrates a plan view of a semiconductor device in accordance with embodiments.

Embodiments will be described more fully hereinafter with reference to the accompanying drawings, in which exemplary embodiments are shown. The exemplary embodiments may, however, be embodied in many different forms and should not be construed as limited to those set forth herein. Rather, these embodiments are provided so that this disclosure will be thorough and complete, and will fully convey the scope of exemplary implementations to those skilled in the art. In the drawings, the sizes and relative sizes of layers, elements, and regions may be exaggerated for clarity. Like reference numerals refer to like elements throughout.

It will also be understood that when an element such as a layer, region or substrate is referred to as being "on" or "onto" another element, it may lie directly on the other element or intervening elements or layers may also be present. Further, it will also be understood that, although the terms first, second, etc. may be used herein to describe various elements, these elements should not be limited by these terms. These terms are only used to distinguish one element from another.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Figure 2A:
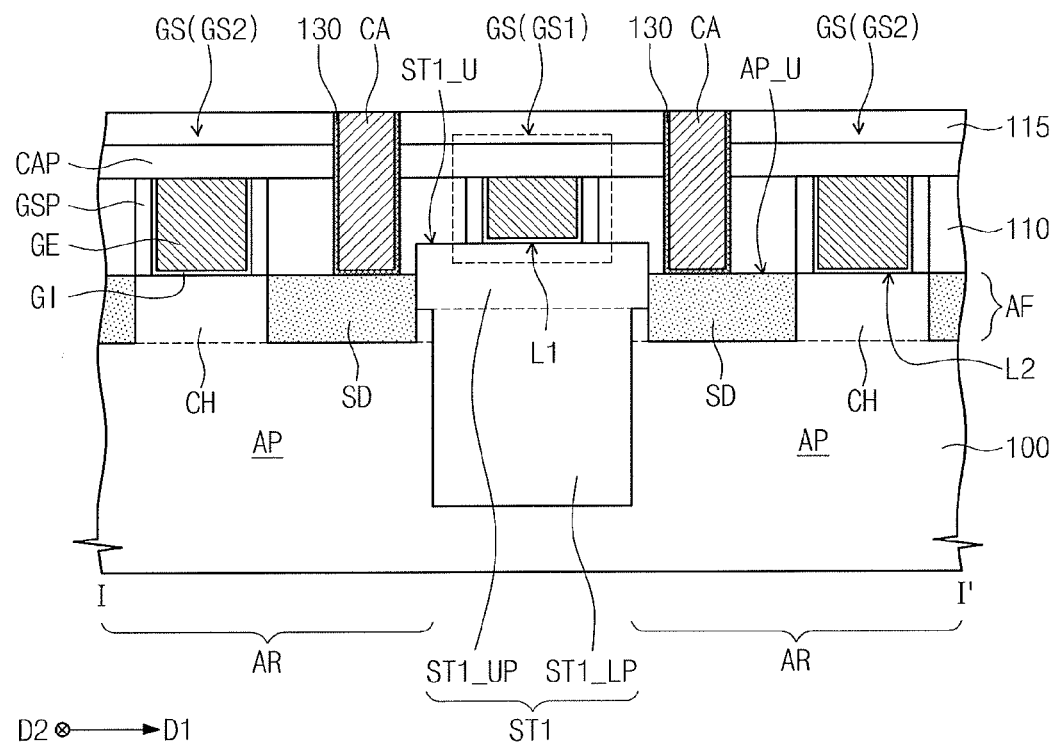
FIGS. 2A and 2B are cross-sectional views along lines I-I' and II-II' of FIG. 1, respectively.
Figure 2B:
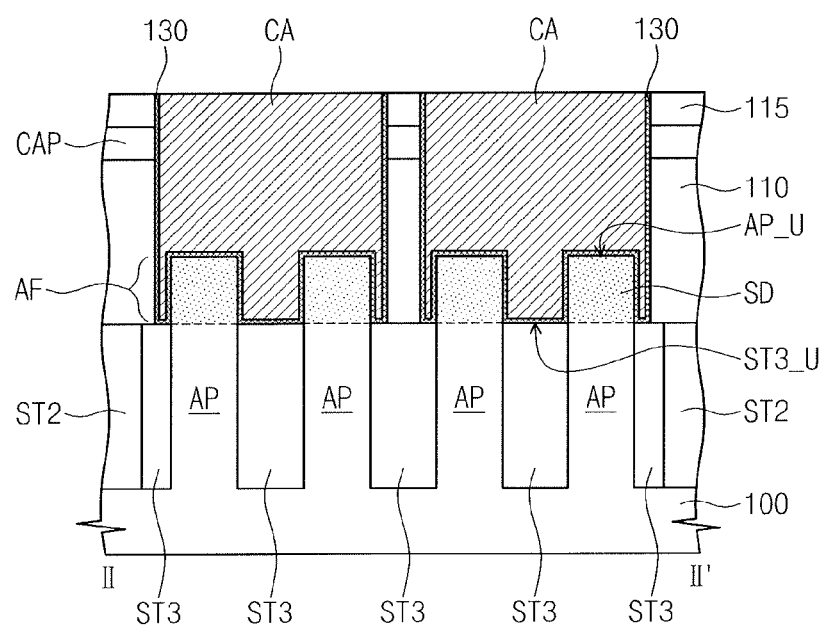

FIG. 1 is a plan view of a semiconductor device in accordance with embodiments. FIGS. 2A and 2B are cross-sectional views illustrating a semiconductor device according to a first embodiment along lines I-I' and II-IF of FIG. 1, respectively.

Referring to FIG. 1 and FIGS. 2A and 2B, a semiconductor device may include a first and a second logic cells C1, C2 adjacent to each other. In the present specification, a "logic cell" may refer to a unit for performing one Boolean logic function (e.g., INVERTER, AND, OR, NAND, NOR, etc.) or one storage function (e.g., FLIP-FLOP). Hereinafter, embodiments are described based on the first logic cell C1, but the second logic cell C2 may have a structure which is identical or similar to the first logic cell C1.

The first logic cell C1 may include active regions AR separated from each other by a device isolation ST. A cell boundary Cb may be defined between the first logic cell C1 and the second logic cell C2.

The device isolation layer ST may include a first device isolation layer ST1 and a second device isolation layer ST2. The first device isolation layer ST1 may separate the active regions AR from each other. The active regions AR may be spaced apart from each other in a first direction D1 with the first device isolation layer ST1 between them. The second device isolation layer ST2 may separate the first logic cell C1 from the second logic cell C2. The first logic cell C1 and the second logic cell C2 may be adjacent to each other in a second direction D2 crossing the first direction D1. The first device isolation layer ST1 may extend in the second direction D2, and the second device isolation layer ST2 may extend in the first direction D1. The first device isolation layer ST1 and the second device isolation layer ST2 may be parts of one insulating layer, e.g., parts of a same insulating layer, substantially connected to one another. The device isolation layer ST may be formed on a substrate 100. The substrate 100 may be, e.g., a silicon substrate, a germanium substrate or a SOI (silicon on insulator) substrate. The device isolation layer ST may include, e.g., a silicon oxide layer.

Each of the active regions AR may include a plurality of active patterns AP protruding from the substrate 100. The active patterns AP may extend in the first direction D1 and be spaced apart from each other in the direction D2. For example, as illustrated FIG. 1, each of the active regions AR may include four active patterns AP, but embodiments are not limited thereto. The device isolation layer ST may further include third device isolation layers ST3 provided on both sides of the active patterns AP. The third device isolation layer ST3 extending in the first direction D1 may be connected to the first device isolation layer ST1. The first through third device isolation layers ST1, ST2 and ST3 may be substantially parts of one, e.g., same, insulating layer connected to each other.

According to an embodiment, each of the active patterns AP may include an upper region (hereinafter it is referred to as an active fin AF) exposed by the third device isolation layer ST3 (FIG. 2B). That is, a top surface ST3_U of the third device isolation layer ST3 may be located at a lower level than a top surface AP_U of the active pattern AP. A top surface of the second device isolation layer ST2 may be substantially coplanar with the top surface ST3_U of the third device isolation layer ST3.

The first device isolation layer ST1 may have a width along a direction parallel to a top surface of the substrate 100. As illustrated in FIG. 2A, a width of an upper portion ST1_UP of the first device isolation layer ST1 may be greater than a width of a lower portion ST1_LP of the first device isolation layer ST1. A top surface ST1_U of the first device isolation layer ST1 may be located at a higher level than the top surface AP_U of the active pattern AP.

As illustrated in FIG. 1, gate structures GS extending in the second direction D2 and being spaced apart from one another in the first direction D1 may be provided on the substrate 100. The gate structures GS may include a first gate structure GS1 provided on the first device isolation ST1 between the active regions AR, and second gate structures GS2 provided on the active regions AR. Each of the second gate structures GS2 may cross the active patterns AP spaced apart from one another in the second direction D2. The first gate structure GS1 may be spaced apart from the active patterns AP.

As illustrated in FIG. 2A, each of the gate structures GS may include a gate electrode GE extending in the second direction D2, a gate insulating pattern GI extending along a bottom surface of the gate electrode GE, a capping pattern CAP extending along a top surface of the gate electrode GE, and gate spacers GSP formed on opposite sidewalls of the gate electrode GE. The gate insulating pattern GI may extend between the gate electrode GE and the gate spacers GSP. The capping pattern CAP extending in the first direction D1 may cover top surfaces of the plurality of gate electrodes GE.

The gate electrode GE may include a conductive material. For example, the gate electrode GE may include at least one of doped semiconductor, metal, and conductive metallic nitride. The gate insulating pattern GI may include, e.g., a silicon oxide layer, a silicon oxynitride layer, or a dielectric layer having a dielectric constant higher than the silicon oxide layer. The capping pattern CAP and the gate spacers GSP may include at least one of, e.g., a silicon oxide layer, a silicon nitride layer, and a silicon oxynitride layer, respectively.

A bottom surface L1 of the first gate structure GS1 may be in, e.g., direct, contact with the top surface ST1_U of the first device isolation layer ST1. That is, the gate insulating pattern GI of the first gate structure GS1 may be in, e.g., direct, contact with the top surface ST1_U of the first device isolation layer ST1. The bottom surface L1 of the first gate structure GS1 may be located at a higher level than the top surfaces AP_U of the active patterns AP. Bottom surfaces L2 of the second gate structures GS2 may be in contact with the top surfaces AP_U of the active patterns AP.

Source/drain regions SD may be provided in the active patterns AP at both, e.g., opposite, sides of each of the second gate structures GS2. According to an embodiment, the source/drain regions SD may be impurity regions provided in the active fin AF at both sides of each second gate structure GS2. According to another embodiment, the source/drain SD may be epitaxial layers formed using the active patterns AP as seed. A region of the active pattern AP which is located under the second gate structure GS2 and overlaps the second gate structure GS2 may be used as a channel region CH.

The first gate structure GS1 may be electrically insulated from the adjacent source/drain region SD by the first device isolation layer ST1. That is, the first gate structure GS1 may be a dummy gate structure which does not constitute a transistor in the first logic cell C1. The gate structures GS extending in the second direction D2 may cross the cell boundary Cb between the first logic cell C1 and the second logic cell C2. The gate structures GS may extend on the second logic cell C2.

The first gate structure GS1 extending in the second direction D2 may cross an active pattern AP provided in the second logic cell C2. In the second logic cell C2, source/drain regions SD may be provided in the active pattern AP at both sides of the first gate structure GS1. In the second logic cell C2, a region of the active pattern AP which is located under the first gate structure GS1 and overlaps the first gate structure GS1 may be used as a channel region. That is, the first gate structure GS1 may constitute a transistor in the second logic cell C2.

According to an embodiment, the top surface ST1_U of the first device isolation ST1 may be located at higher level than the top surface AP_U of the active pattern AP, and the first gate structure GS1 may be provided on the top surface ST1_U of the first device isolation layer ST1. Accordingly, in the first logic cell C1, the first gate structure GS1 may be easily insulated from adjacent source/drain regions SD by the first device isolation layer ST1.

A first interlayer insulating layer 110 covering the gate structure GS may be provided on the substrate 100. The first interlayer insulating layer 110 may be disposed between the gate structures GS. A top surface of the gate electrode GE of each gate structure GS may be substantially coplanar with a top surface of the first interlayer insulating layer 110. The capping pattern CAP may extend on the first interlayer insulating layer 110. A second interlayer insulating layer 115 may be provided on the capping pattern CAP. The first and second interlayer insulating layer 110 and 115 may include at least one of, e.g., a silicon oxide layer or a silicon oxynitride layer.

Source/drain contacts CA penetrating the second interlayer insulating layer 115, the capping pattern CAP, and the first interlayer insulating layer 110 may be connected to the source/drain regions SD. A barrier pattern 130 may be provided between each source/drain contact CA and the first interlayer insulating layer 110. The barrier pattern 130 may extend between each source/drain contact CA and the capping pattern CAP, and between each source/drain contact CA and the second interlayer insulating layer 115. In addition, the barrier pattern 130 may extend between each source/drain contact CA and the substrate 100. The barrier pattern 130 may include at least one of metal and metallic nitride. For example, the barrier pattern 130 may include titanium, and/or titanium nitride.

In addition, conductive patterns may be provided between the source/drain contacts CA and the source/drain regions SD. The source/drain contacts CA may electrically connect the source/drain regions SD through the conductive patterns. Each of the conductive patterns may electrically connect the source/drain regions SD spaced apart from each other in the second direction D2 with the third device isolation layer ST3 between them. The conductive patterns may directly contact the source/drain regions SD. The conductive patterns may include, e.g., a metal-silicide layer and a metal layer on the metal-silicide layer. The source/drain contacts CA may have various shapes. For example, when viewed from a plan view, the source/drain contacts CA may have a bar shape extending in the second direction D2. The source/drain contacts CA may include at least one of doped semiconductor, metal, or conductive metallic nitride. Top surfaces of the source/drain contacts CA may be substantially coplanar with a top surface of the second interlayer insulating layer 115.

A gate contact CB electrically connected to the gate electrode GE may be provided on each gate structure GS (FIG. 1). The gate contact CB may penetrate the second interlayer insulating layer 115 and the capping pattern CAP to be connected to the gate electrode GE. A top surface of source/drain contact CA and a top surface of the gate contact CB may be substantially coplanar with a top surface of the second interlayer insulating layer 115. The source/drain contact CA and the gate contact CB may include the same material. The gate contact CB may include at least one of, e.g., doped semiconductor, metal, or conductive metallic nitride.

Wiring lines may be provided on the substrate 100 to be connected to the source/drain contacts CA and the gate contact CB. The wiring lines may apply voltage to the source/drain regions SD and the gate electrode GE through the source/drain contacts CA and the gate contact CB, respectively.

FIGS. 3A through 5A are drawings illustrating a method of manufacturing a semiconductor device according to a first embodiment, and are cross-sectional views taken along the line I-I' of FIG. 1. FIGS. 3B through 5B are drawings illustrating a method of manufacturing a semiconductor device according to the first embodiment, and are cross-sectional views taken along the line II-II' of FIG. 1.

Figure 3A:
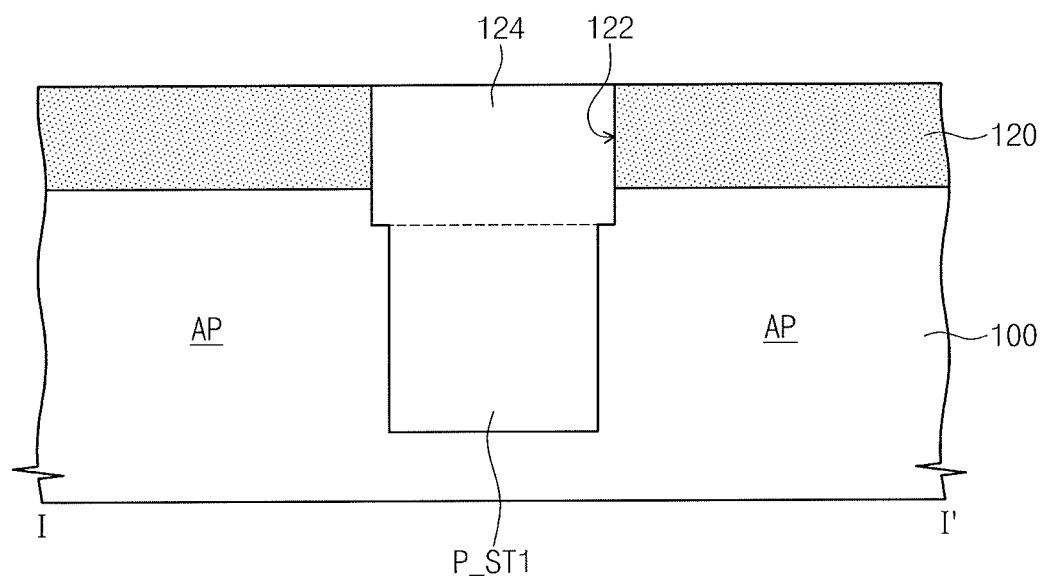
FIGS. 3A, 4A, and 5A illustrate stages in a method of manufacturing a semiconductor device according to a first embodiment, and are cross-sectional views along line I-I' of FIG. 1.
Figure 3B:
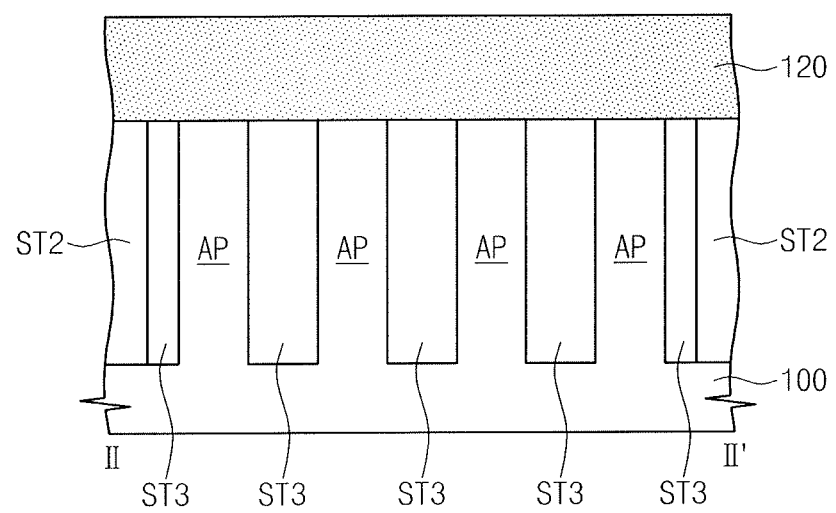
FIGS. 3B, 4B, and 5B illustrate stages in a method of manufacturing a semiconductor device according to a first embodiment, and are cross-sectional views along line II-II' of FIG. 1.

Referring to FIG. 1 and FIGS. 3A and 3B, a first preliminary device isolation layer P_ST1 and the second device isolation layer ST2 may be formed on the substrate 100. The substrate 100 may be, e.g., a silicon substrate, a germanium substrate, or a SOI (Silicon On Insulator) substrate. The active regions AR may be spaced apart from each other in the first direction D1 with the first preliminary device isolation layer P_ST1 between them. The first preliminary device isolation layer P_ST1 may extend in the second direction D2 to separate the active regions AR from each other. The second device isolation layer ST2 may extend in the first direction D1 to separate a first logic cell C1 and a second logic cell C2 adjacent to each other. The first preliminary device isolation layer P_ST1 and the second device isolation layer ST2 may be formed by a STI (shallow trench isolation) process.

The third device isolation layers ST3 may be formed on the substrate 100. The third device isolations ST3 may extend in the first direction D1 to define active patterns AP in each active region. The third device isolation layer ST3 may extend in the first direction D1 and thereby the active patterns AP may extend in the first direction D1. The active patterns AP may be spaced apart from one another in the second direction D2. The third device isolation layer ST3 may be formed by a STI (shallow trench isolation) process. The first preliminary device isolation layer P_ST1, the second device isolation layer ST2, and the third device isolation ST3 may include, e.g., a silicon oxide layer. A top surface of the first preliminary device isolation layer P_ST1, a top surface of the second device isolation layer ST2, and a top surface of the third device isolation ST3 may be substantially coplanar with a top surface of the active pattern AP.

A mask pattern 120 having openings 122 and exposing the top surface of the first preliminary device isolation layer P_ST1 may be formed on the substrate 100. The opening 122 may expose end regions of the active patterns AP provided on both sides of the first preliminary device isolation layer P_ST1. The mask pattern 120 may include a SOH (spin on hard-mask) layer. The opening 122 may extend along the top surface of the first preliminary device isolation layer P_ST1.

An upper portion of the first preliminary device isolation layer P_ST1 may be etched using the mask pattern 120 as an etching mask. Thus, a lower portion of the first preliminary device isolation layer P_ST1 may remain between the active regions AR. The end regions of the active pattern AP exposed by the opening 122 may be partially etched during the etching process. The second and the third device isolation layers ST2, ST3 covered by the mask pattern 120 may not be etched during the etching process.

An insulating pattern 124 may be formed in the opening 122. The insulating pattern 124 may be in contact with the lower portion of the first preliminary device isolation layer P_ST1. Forming the insulating pattern 124 may include forming an insulating layer (not shown) filling the opening 122 on the mask pattern 120 and planarizing the insulating layer until a top surface of the mask pattern 124 is exposed.

The insulating pattern 124 may include the same material as the first preliminary device isolation layer P_ST1. The insulating pattern 124 may include, e.g., a silicon oxide layer. Accordingly, the insulating pattern 124 may be in contact with the lower portion of the first preliminary device isolation layer P_ST1 to form a single body.

Figure 4A:
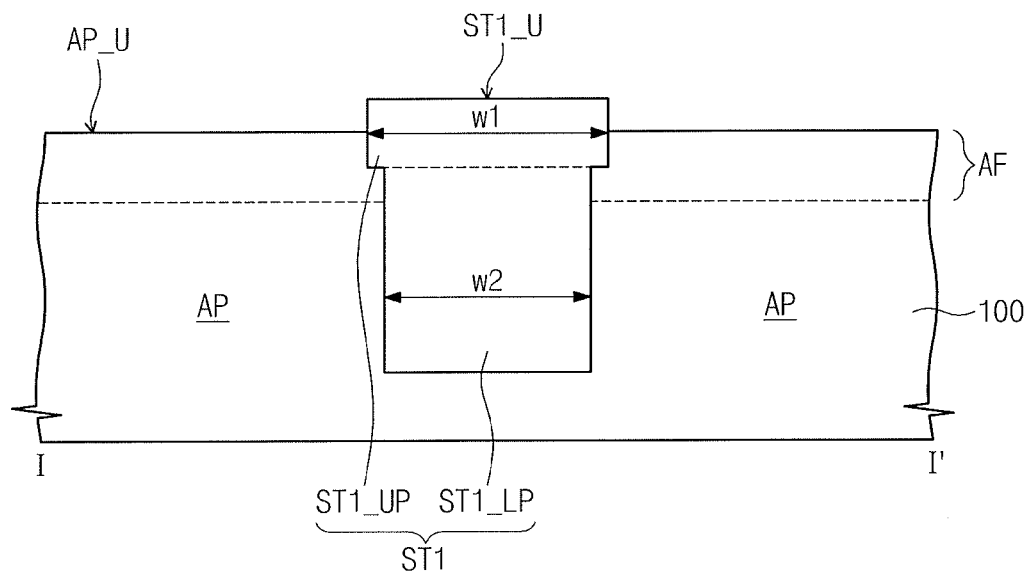
Figure 4B:
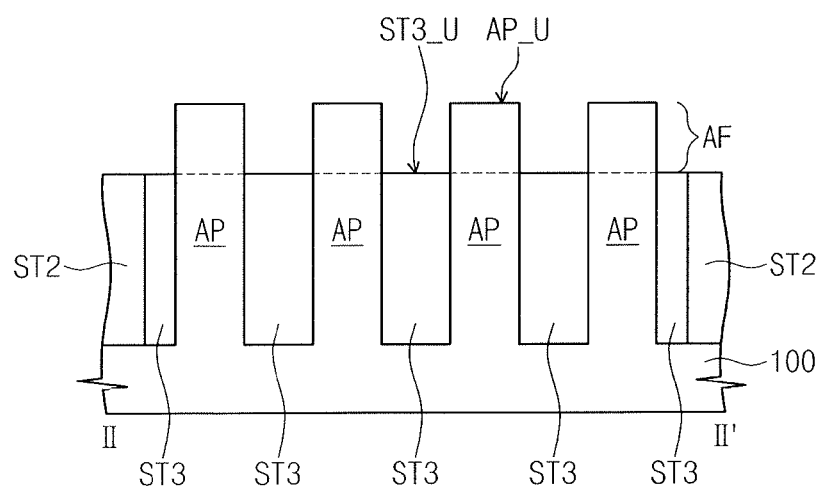

Referring to FIG. 1 and FIGS. 4A and 4B, the mask pattern 120 may be removed. The mask pattern 120 may be removed using an ashing process and/or a strip process.

After that, the third device isolation layers ST3 may be etched to expose upper portions of the active patterns AP. Each upper region of the active patterns AP exposed by the third device isolation layers ST3 may be defined as the active fin AF. Accordingly, a top surface ST3_U of the third device isolation layer ST3 may be located at a lower level than a top surface SP_U of the active fin AF.

During the etching process of the third device isolation layers ST3, an upper portion of the second device isolation layer ST2 may be etched. Accordingly, a top surface of the second device isolation layer ST2 may be substantially coplanar with the top surfaces ST3_U of the third device isolation layer ST3.

During the etching process of the third device isolation layers ST3, an upper portion of the insulating pattern 124 may be etched. The first device isolation layer ST1 may be defined by an etched insulating pattern 124 and the lower portion of the first preliminary device isolation layer P_ST1. That is, the etched insulating pattern 124 may be defined as the upper portion ST1_UP of the first device isolation layer ST1, and the lower portion of the first preliminary device isolation layer P_ST1 may be defined as the lower portion ST1_LP of the first device isolation layer ST1. A width w1 of the upper portion ST1_UP of the first device isolation layer ST1 may be greater than a width w2 of the lower portion ST1_LP of the first device isolation layer ST1. A top surface ST1_U of the first device isolation layer ST1 may be located at a higher level than the top surface AP_U of the active pattern AP.

Figure 5A:
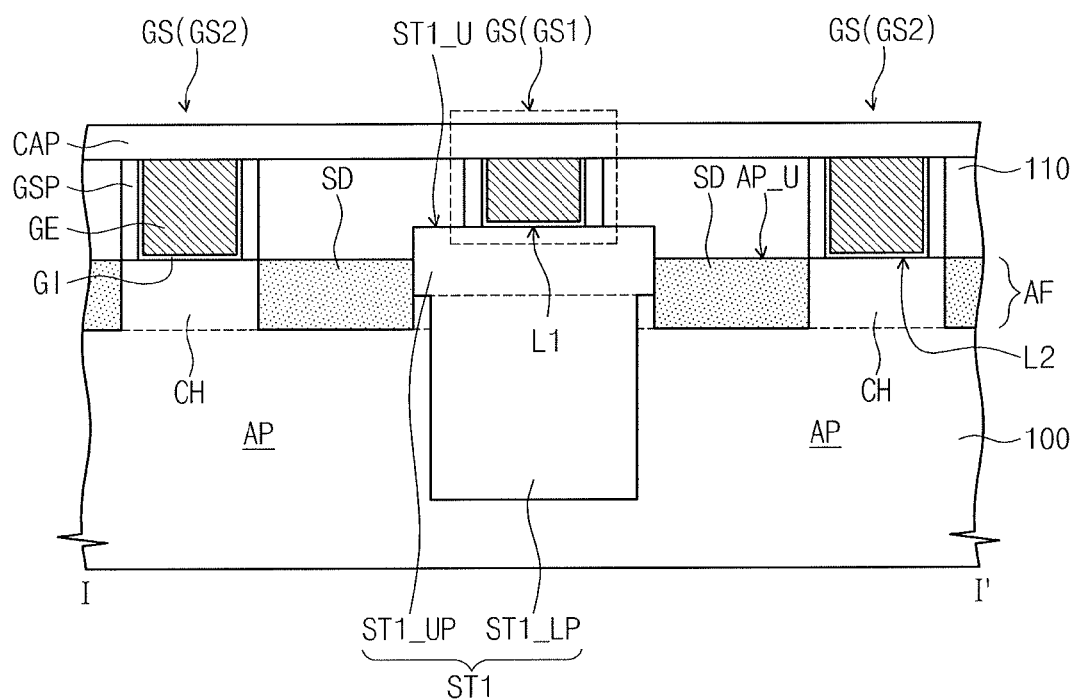
Figure 5B:
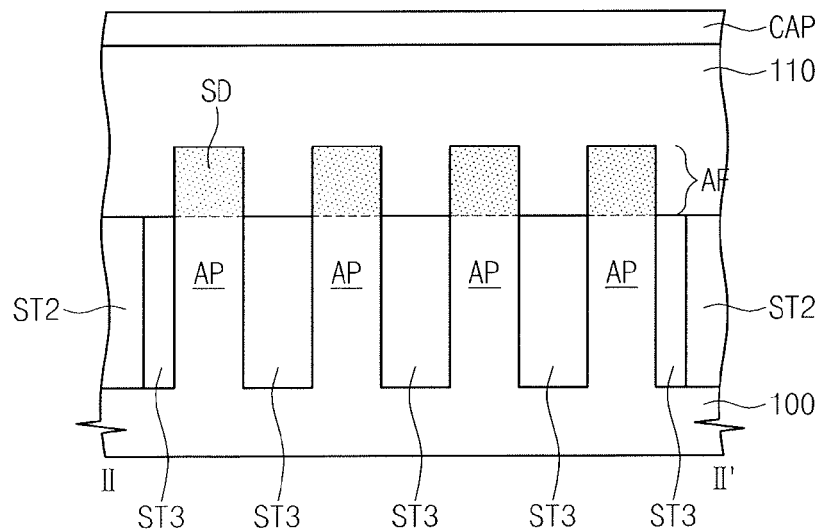

Referring to FIG. 1 and FIGS. 5A and 5B, the gate structures GS extending in a second direction D2 and being spaced apart from one another in a first direction D1 may be formed on the substrate 100. For example, forming the gate structures GS may include forming sacrificial gate patterns on the substrate 110, forming the gate spacers GSP along opposite sidewalls of each of the sacrificial gate patterns, forming the first interlayer insulating layer 110 covering the sacrificial gate patterns and the gate spacers GSP, planarizing the first insulating layer until the sacrificial gate patterns is exposed, forming gap regions between the gate spacers GSP after removing the sacrificial gate patterns, forming a gate insulating layer filling a portion of the gap region on the first interlayer insulating layer 110, forming a gate electrode layer filling remainder of the gap region on the gate insulating layer, and planarizing the gate insulating layer and the gate electrode layer until a top surface of the first interlayer insulating layer 110 is exposed. Accordingly, the gate insulating patterns GI and gate electrodes GE may be formed in the gap regions. An upper portion of the gate spacers GSP may be planarized by the planarization process. By the planarization process, a top surface of the gate insulating pattern GI, a top surface of the gate electrode GE, and top surfaces of the gate spaces GSP may be substantially coplanar with a top surface of the first interlayer insulating layer 110. In this case, as illustrated in FIG. 5A, the gate insulating pattern GI may extend between the gate electrode GE and the gate spacers GSP.

After that, the capping pattern CAP may be formed on the first interlayer insulating layer 110. The capping pattern CAP may cover the top surface of the gate insulating pattern GI, the top surface of the gate electrode GE, and the top surfaces of the gate spacers GSP.

In another example, forming the gate structure GS may include sequentially forming a gate insulating layer, a gate electrode layer, and a capping layer on the substrate 110, and forming the capping pattern CAP, the gate electrode GE, and the gate insulating pattern GI by sequentially patterning the capping layer, the gate electrode layer, and the gate insulating layer. In this case, unlike that illustrated in FIG. 5A, the gate insulating pattern GI may be locally formed under the gate electrode GE, and the capping pattern CAP may be locally formed on the top surface of the gate electrode GE. Forming the gate structure GS may further include forming gate spacers GSP along opposite sidewalls of the gate electrode GE. Forming the gate spacers GSP may include forming a gate spacer layer (not shown) that covers the gate insulating pattern GI, the gate electrode GE, and the gate capping pattern CAP, and performing an anisotropic etching process on the gate spacer layer.

The gate structure GS may include the first gate structure GS1 and the second gate structure GS2. The first gate structure GS1 may be provided on the first device isolation layer ST1 and between the active regions AR, and the second gate structure GS2 may be provided on the active regions AR. Each of the second gate structures GS2 may cross the active patterns AP and be spaced apart from one another in the second direction D2. The first gate structure GS1 may be spaced apart from the active patterns AP.

A bottom surface L1 of the first gate structure GS1 may contact the top surface ST1_U of the first device isolation layer ST1. The gate insulating pattern GI of the gate structure GS1 may contact the top surface ST1_U of the first device isolation layer ST1. Accordingly, the bottom surface L1 of the first gate structure GS1 may be located at a higher level than the top surfaces AP_U of the active patterns AP. Bottom surfaces L2 of the second gate structures GS2 may contact the top surfaces AP_U of the active patterns AP.

Source/drain regions SD may be formed in the active patterns AP at both sides of each second gate structures GS2. Forming the source/drain SD may include forming the sacrificial gate patterns and the gate spacers GSP, and performing a selective epitaxial growth process using the active patterns AP of both sides of each sacrificial gate pattern as a seed. For another example, forming the source/drain SD may include performing an ion implantation process on the active patterns AP at both sides of each second gate structures GS2 after forming the gate structures GS.

Referring back to FIG. 1 and FIGS. 2A and 2B, the second interlayer insulating layer 115 covering the gate structures GS may be formed on the substrate 100. According to an embodiment, the second interlayer insulating layer may be formed on the capping pattern CAP. The source/drain contact CA may be formed to penetrate the second interlayer insulating layer 115, the capping pattern CAP, and the first interlayer insulating layer 110, and then connect to the source/drain region SD. The gate contact CB may be formed to penetrate the second interlayer insulating layer 115 and the capping pattern CAP on the gate structure, and then connected to the gate electrode GE. Forming the source/drain contacts CA and the gate contacts CB may include forming contact holes that penetrate the first and second interlayer insulating layers 110, 115 and the capping pattern CAP, and then expose source/drain regions SD, forming gate contact hole that penetrate the second interlayer insulating layer 115 and the capping pattern CAP, and then expose the gate electrode GE, forming a barrier layer filling a portion of each source/drain contact hole and a portion of gate contact hole on the second interlayer insulating layer 115, forming a conductive layer filling a remainder of each source/drain contact hole and a remainder of gate contact hole on the barrier layer, and planarizing the barrier layer and the conductive layer until the second interlayer insulating layer 115 is exposed.

Wiring lines may be formed on the substrate 100. The wiring lines may electrically connect the source/drain contacts CA and the gate contacts CB. The wiring lines may be applied a voltage to the source/drain regions SD and the gate electrodes GE through the source/drain contacts CA and the gate contacts CB, respectively.

Figure 6A:
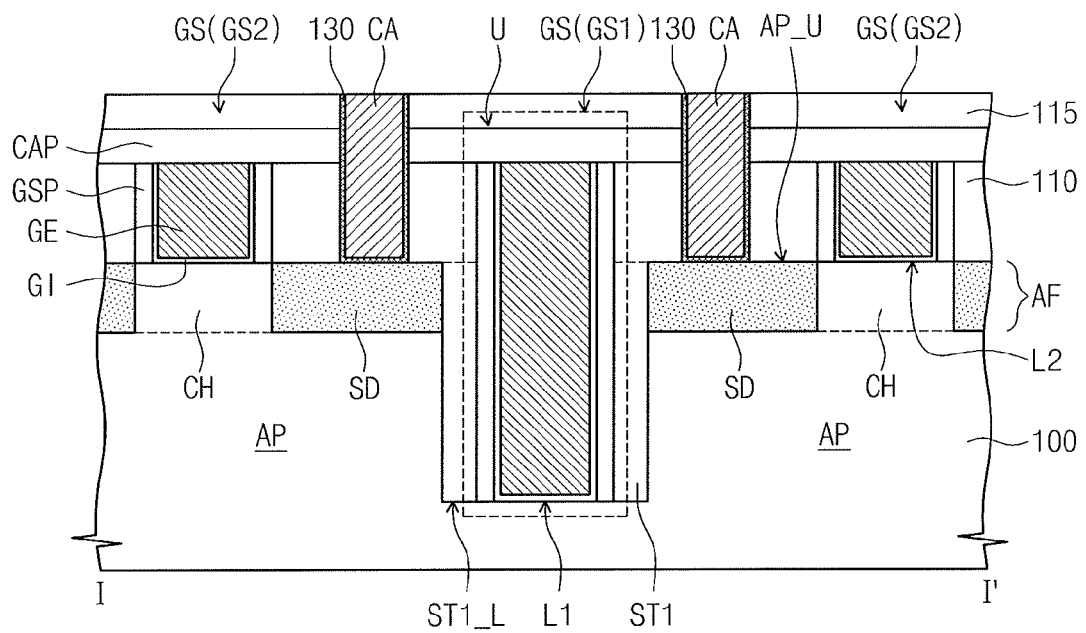
FIGS. 6A and 6B illustrate cross-sectional views along lines I-I' and II-IF of FIG. 1, respectively, according to a second embodiment.
Figure 6B:
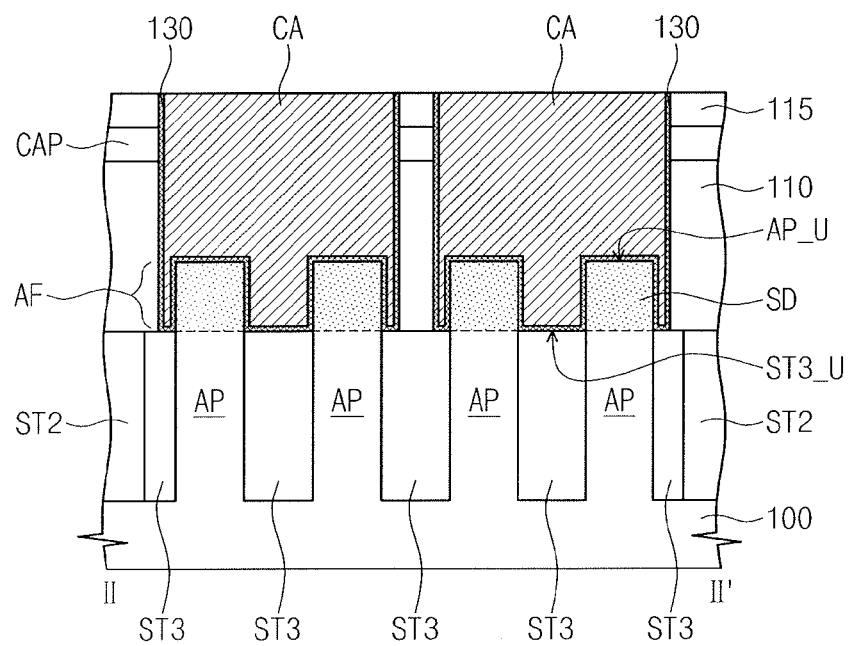

FIGS. 6A and 6B are drawings illustrating a semiconductor device according to a second embodiment, and are cross-sectional views taken along the line I-I' and II-II' of FIG. 1, respectively. The same reference numerals are provided to the same constitution as the semiconductor device according to the first embodiment with reference to FIG. 1 and FIGS. 2A and 2B. The description of common features already discussed above will be omitted.

Referring to FIG. 1 and FIGS. 6A and 6B, a semiconductor device may include a first logic cell C1 and a second logic cell C2 adjacent to each other. The first logic cell C1 may include the active regions AR separated from each other by the device isolation layer ST. The first logic cell C1 may be separated from the second logic cell C2 by the device isolation layer ST. The cell boundary Cb may be defined between the first logic cell C1 and the second logic cell C2 adjacent to each other.

The device isolation layer ST may include the first device isolation layer ST1 and the second device isolation layer ST2. The first device isolation layer ST1 may extend in the direction D2 to separate the active regions AR from each other. The active regions AR may be spaced apart from each other in the first direction D1 with the first device isolation layer ST1 between them. The second device isolation layer ST2 extending in the direction D1 may separate the first logic cell C1 from the second logic cell C2 adjacent to the first logic cell C1.

Each of the active regions AR may include a plurality of active patterns AP protruded from the substrate 100. The active patterns AP may extend in the first direction D1 and be spaced apart from each other in the direction D2. The device isolation layer ST may further include third device isolations ST3 provided on both sides of the active patterns AP. The third device isolation layer ST3 extending in the first direction D1 may be connected to the first device isolation layer ST1.

According to an embodiment, each of the active patterns AP may include an upper region (hereinafter it is referred to as an active fin AF) exposed by the third device isolation layer ST3. The top surface ST3_U of the third device isolation layer ST3 may be located at a lower level than the top surface AP_U of the active pattern AP. A top surface of the second device isolation layer ST2 may be substantially coplanar with the top surface ST3_U of the third device isolation layer ST3.

Gate structures GS extending in the second direction D2 and being spaced apart from one another in the first direction D1 may be provided on the substrate 100. According to an embodiment, the gate structures GS may include the first gate structure GS1 penetrating the first device isolation ST1 between the active regions AR, and the second gate structures GS2 provided on the active regions AR. Each of the second gate structures GS2 may cross the active patterns AP spaced apart from one another in the second direction D2. The first gate structure GS1 may be spaced apart from the active patterns AP.

Each of the gate structures GS may include a gate electrode GE extending in the second direction D2, a gate insulating pattern GI extending along a bottom surface of the gate electrode GE, a capping pattern CAP extending along a top surface of the gate electrode GE, and gate spacers GSP formed on opposite sidewalls of the gate electrode GE. The gate insulating pattern GI may extend between the gate electrode GE and the gate spacers GSP. The capping pattern CAP extending in the first direction D1 may cover top surfaces of the plurality of gate electrodes GE.

According to an embodiment, a bottom surface L1 of the first gate structure GS1 may be in contact with a bottom surface ST1_L of the first device isolation layer ST1. That is, the gate insulating pattern GI of the first gate structure GS1 may be in contact with the bottom surface ST1_L of the first device isolation layer ST1. The top surface U of the first gate structure GS1 may be located at higher level than the top surfaces AP_U of the active patterns AP. Bottom surfaces L2 of the second gate structures GS2 may be in contact with the top surfaces AP_U of the active patterns AP.

Source/drain regions SD may be provided in the active patterns AP of both sides of each of the second gate structures GS2. A region of active pattern AP which is located under the second gate structure GS2 and overlaps the second gate structure GS2 may be used as a channel region CH.

The first gate structure GS1 may be electrically insulated from the adjacent source/drain region SD by the first device isolation layer ST1. That is, the first gate structure GS1 may be a dummy gate structure which does not constitute a transistor in the first logic cell C1. The gate structures GS extending in the second direction D2 may cross the cell boundary Cb between the first logic cell C1 and the second logic cell C2. The gate structures GS may extend on the second logic cell C2.

The first gate structure GS1 extending in the second direction D2 may cross an active pattern AP provided in the second logic cell C2. In the second logic cell C2, source/drain regions SD may be provided in the active pattern AP of both sides of the first gate structure GS1. In the second logic cell C2, a region of the active pattern AP which is located under the first gate structure GS1 and overlaps the first gate structure GS1 may be used as a channel region. That is, the first gate structure GS1 may constitute a transistor.

According to an embodiment, the first gate structure GS1 penetrating the first device isolation ST1 may be easily insulated from the adjacent source/drain regions SD by the first device isolation ST1. In addition, the volume of the gate electrode GE of the first gate structure GS1 may be increased by providing the first gate structure GS1 penetrating the first device isolation layer ST1. Accordingly, in the second logic cell C2, a transistor constituted by the first gate structure GS1 may have a variety of characteristics.

The first interlayer insulating layer 110 covering the gate structure GS may be provided on the substrate 100. The first interlayer insulating layer 110 may be disposed between the gate structures GS. A top surface of the gate electrode GE of each gate structure GS may be substantially coplanar with a top surface of the first interlayer insulating layer 110. The capping pattern CAP may extend on the first interlayer insulating layer 110. The first interlayer insulating layer 110 may include at least one of a silicon oxide layer or a silicon oxynitride layer.

According to an embodiment, the first device isolation layer ST1 may include the same material as the first interlayer insulating layer 110. The first device isolation layer ST1 may be connected to the first interlayer insulating layer 110 to form a single body.

The second interlayer insulating layer 115 may be provided on the capping pattern CAP. The second interlayer insulating layer 115 may include at least one of a silicon oxide layer or a silicon oxynitride layer.

The source/drain contacts CA penetrating the second interlayer insulating layer 115, the capping pattern CAP, and the first interlayer insulating layer 110 may be connected to the source/drain regions SD. The barrier pattern 130 may be provided between each source/drain contact CA and the first interlayer insulating layer 110. The barrier pattern 130 may extend between each source/drain contact CA and the capping pattern CAP, and between each source/drain contact CA and the second interlayer insulating layer 115. In addition, the barrier pattern 130 may extend between each source/drain contact CA and the substrate 100. The gate contact CB electrically connected to the gate electrode GE may be provided on each gate structure GS. The gate contact CB may penetrate the second interlayer insulating layer 115 and the capping pattern CAP to be connected to the gate electrode GE. A top surface of source/drain contact CA and a top surface of the gate contact CB may be substantially coplanar with a top surface of the second interlayer insulating layer 115. The source/drain contact CA and the gate contact CB may include the same material.

Wiring lines may be provided on the substrate 100 to be connected to the source/drain contacts CA and the gate contact CB. The wiring lines may apply a voltage to the source/drain regions SD and the gate electrode GE through the source/drain contacts CA and the gate contact CB, respectively.

Figure 7A:
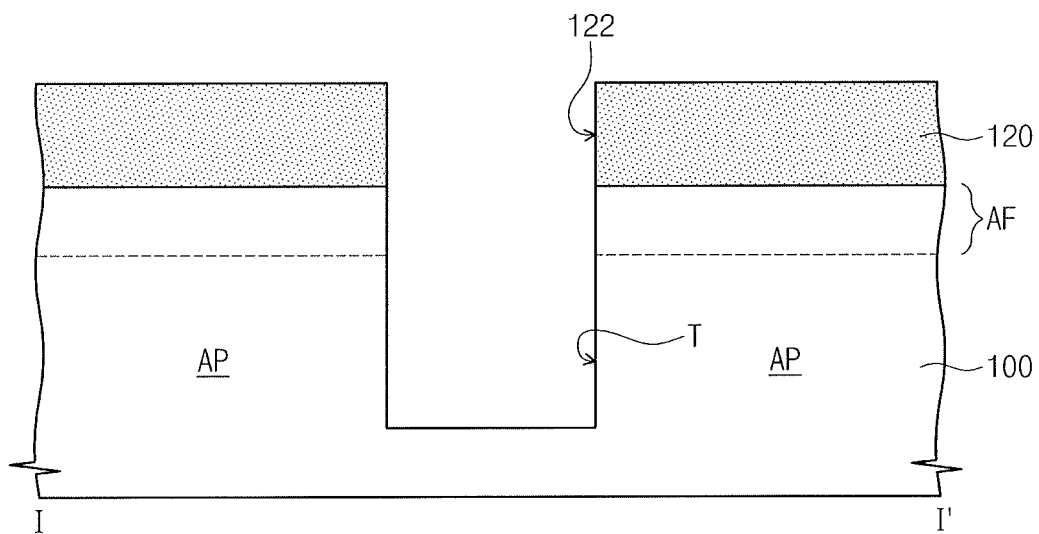
FIGS. 7A and 8A illustrate stages in a method of manufacturing a semiconductor device according to the second embodiment, and are cross-sectional views along line I-I' of FIG. 1.
Figure 7B:
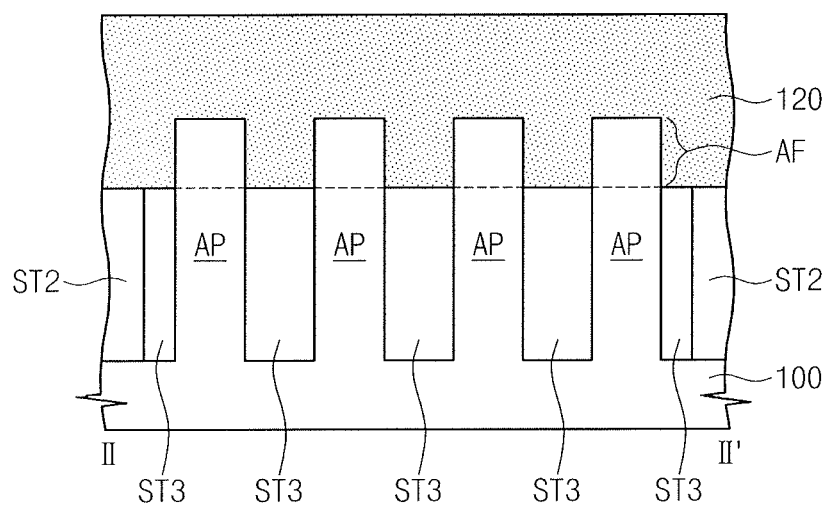
FIGS. 7B and 8B illustrate stages in a method of manufacturing a semiconductor device according to the second embodiment, and are cross-sectional views along line II-II' of FIG. 1.
Figure 8A:
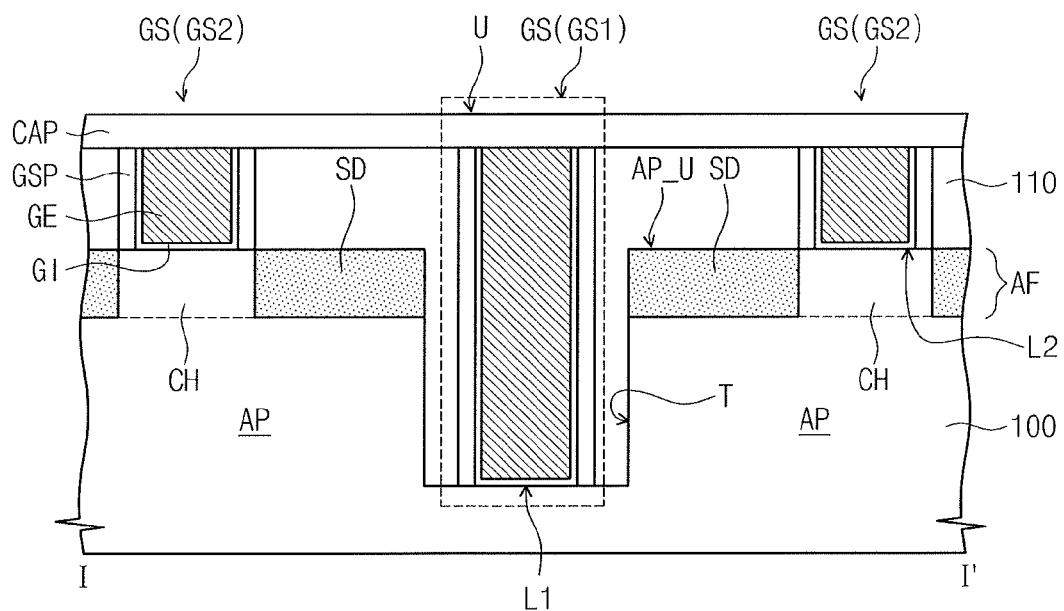
Figure 8B:
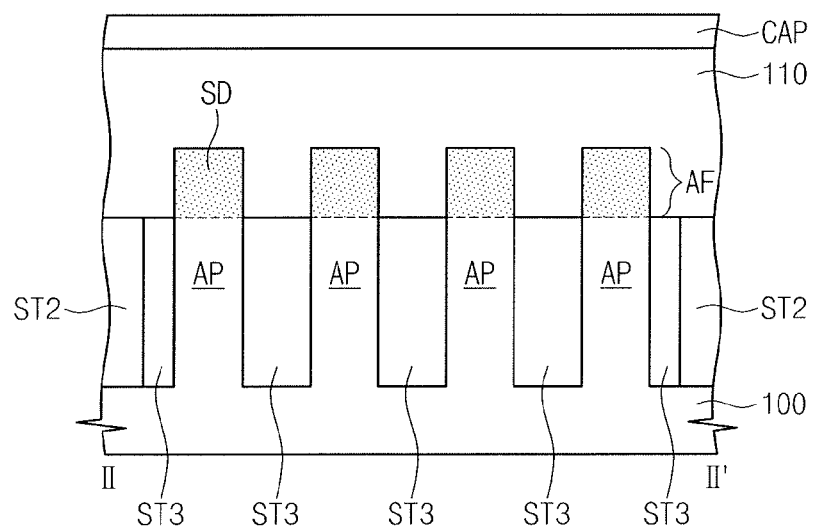

FIGS. 7A and 8A are drawings illustrating a method of manufacturing a semiconductor device according to a second embodiment, and are cross-sectional views taken along the line I-I' of FIG. 1. FIGS. 7B and 8B are drawings illustrating the method of manufacturing the semiconductor device according to the second embodiment, and are cross-sectional views taken along the line II-II' of FIG. 1. The same reference numerals are provided to the same constitution as the method of manufacturing the semiconductor device in accordance with the first embodiment with reference to FIG. 1, FIGS. 3A through 5A and FIGS. 3B through 5B. The description of common features already described above will be omitted.

Referring to FIG. 1 and FIGS. 7A and 7B, a first preliminary device isolation layer (not shown) and the second device isolation layer ST2 may be formed on the substrate 100. In the first logic cell C1, the first preliminary device isolation layer may extend in the second direction D2 to separate the active regions AR from each other. The active regions AR may be spaced apart from each other in the first direction D1. The second device isolation layer ST2 may extend in the first direction D1 to separate the first logic cell C1 and the second logic cell C2 adjacent to the first logic cell C1. The first preliminary device isolation layer and the second device isolation layer ST2 may be formed by a STI (shallow trench isolation) process. In addition, the third device isolation layer ST3 may be formed on the substrate 100. The third device isolation layers ST3 may extend in the first direction D1 to define active patterns AP in each active region AR. The third device isolation layer ST3 may be formed by the STI (shallow trench isolation) process. The first preliminary device isolation layer, the second device isolation layer ST2, and the third device isolation layer ST3 may be parts of one insulating layer substantially connected to one another. A top surface of the first preliminary device isolation layer, a top surface of the second device isolation layer ST2, and a top surface of the third device isolation ST3 may be substantially coplanar with a top surface of the active pattern AP.

An upper portion of the third device isolation layer ST3 may be etched to expose an upper region of the active pattern AP. The upper region of the active pattern AP exposed by the third device isolation layer ST3 may be defined as the active fin AF. During the etching process, the first preliminary device isolation layer and the second device isolation layer ST2 may be etched. Accordingly, the top surface of the first preliminary device isolation layer and the top surface of the second device isolation layer ST2 may be substantially coplanar with the top surface of the third device isolation layer ST3.

The mask pattern 120 having the opening 122 and exposing the top surface of the first preliminary device isolation layer may be formed on the substrate 100. The mask pattern 120 may include a SOH ((spin on hard-mask) layer. The opening 122 may extend along the top surface of the first preliminary device isolation layer.

The first preliminary device isolation layer may be removed by performing an etching process using the mask pattern 120 as an etching mask. Thus, a trench T exposing the substrate 100 may be formed between the active regions AR. The second and the third device isolation layer ST2, ST3 covered by the mask pattern 120 may not be etched during the etching process.

Referring to FIG. 1 and FIGS. 8A and 8B, the mask pattern 120 may be removed. The mask pattern 120 may be removed using an ashing process and/or a strip process.

After that, gate structures GS extending in the second direction D2 and being spaced apart from each other in the first direction D1 may be formed on the substrate 100. Forming the gate structures GS may be substantially the same as the method of manufacturing the semiconductor device in accordance with the first embodiment described with reference to FIG. 1, FIG. 5A and FIG. 5B. For example, forming the gate structures GS may include forming sacrificial patterns and gate spacers GSP, forming the first interlayer insulating layer 110 covering the sacrificial patterns, planarizing the first insulating layer until the sacrificial gate patterns is exposed, forming gap regions between the gate spacers GSP after removing the sacrificial gate patterns and forming gate insulating patterns GI and gate electrodes GE in the gap regions. After that, the capping pattern CAP covering a top surface of the gate insulating pattern GI, a top surface of the gate electrode GE, and a top surface of the gate spacer GSP may be formed on the first interlayer insulating layer 110.

According to the embodiment, the gate structures GS may include the first gate structure GS1 provided in the trench T disposed between the active regions AR and second gate structures GS2 provided on the active regions AR. Each of the second gate structures GS2 may cross the active patterns AP spaced apart from each other in the second direction D2. The first gate structure GS1 may be spaced apart from the active patterns AP.

The bottom surface L1 of the first gate structure GS1 may be in contact with a bottom surface of the trench T. That is, the gate insulating pattern GI of the first gate structure GS1 may be in contact with the bottom surface of the trench T. Opposite sidewalls of the first gate structure GS1 may be spaced apart from inner sidewalls of the trench T. Thus, the first gate structure GS1 may be formed to partially fill the trench T, and the first interlayer insulating layer 110 may be formed to fill the remainder of the trench T. That is, a part of the first interlayer insulating layer 110 may extend between the opposite sidewalls of the first gate structure GS1 and the inner sidewalls of the trench T.

The top surface U of the first gate structure GS1 may be located at a higher level than a top surface of the active pattern AP. The bottom surface L2 of the second gate structure GS2 may be in contact with the top surface AP_U of the active pattern AP.

The Source/drain regions SD may be formed in the active patterns AP at both sides of each second gate structure GS2. Forming the source/drain regions SD may be the same as the method of manufacturing the semiconductor device in accordance with the first embodiment with reference to FIG. 1, FIG. 5A and FIG. 5B.

Referring back to FIG. 1 and FIGS. 6A and 6B, the first interlayer insulating layer 110 may be formed to completely fill the trench T. Thus, the first device isolation layer ST1 separating the active regions AR from each other may be defined. The device isolation layer ST1 may extend in the second direction D2. The first gate structure GS1 may penetrate the first device isolation layer ST1.

The second interlayer insulating layer 115 may be formed on the capping pattern CAP. The source/drain contacts CA connected to the source/drain regions SD may be formed. The source/drain contacts CA may penetrate the second interlayer insulating layer 115, the capping pattern CAP, and the first interlayer insulating layer 110. The gate contact CB connected to the gate electrode GE may be formed on each gate structure GS. The gate contact CB may penetrate the second interlayer insulating layer 115 and the capping pattern CAP. Forming the source/drain contacts CA and the gate contact CB may be the same as the method of manufacturing the semiconductor device in accordance with the first embodiment.

Wiring lines may be formed on the substrate 100. The wiring lines may electrically connect the source/drain contacts CA and the gate contacts CB. The wiring lines may be applied voltage to the source/drain regions SD and the gate electrodes GE through the source/drain contacts CA and the gate contacts CB, respectively.

Figure 9:
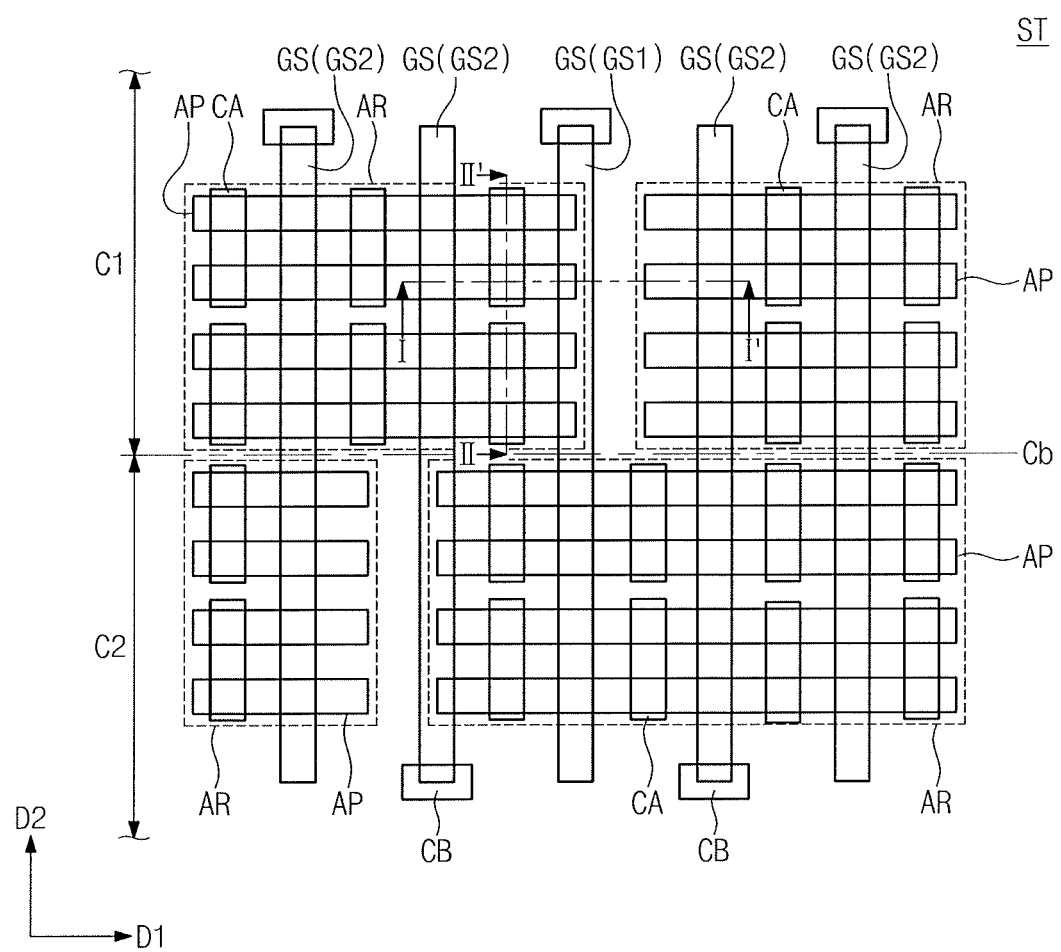
FIG. 9 illustrates a plan view of a semiconductor device in accordance with modified examples of some embodiments.
Figure 10A:
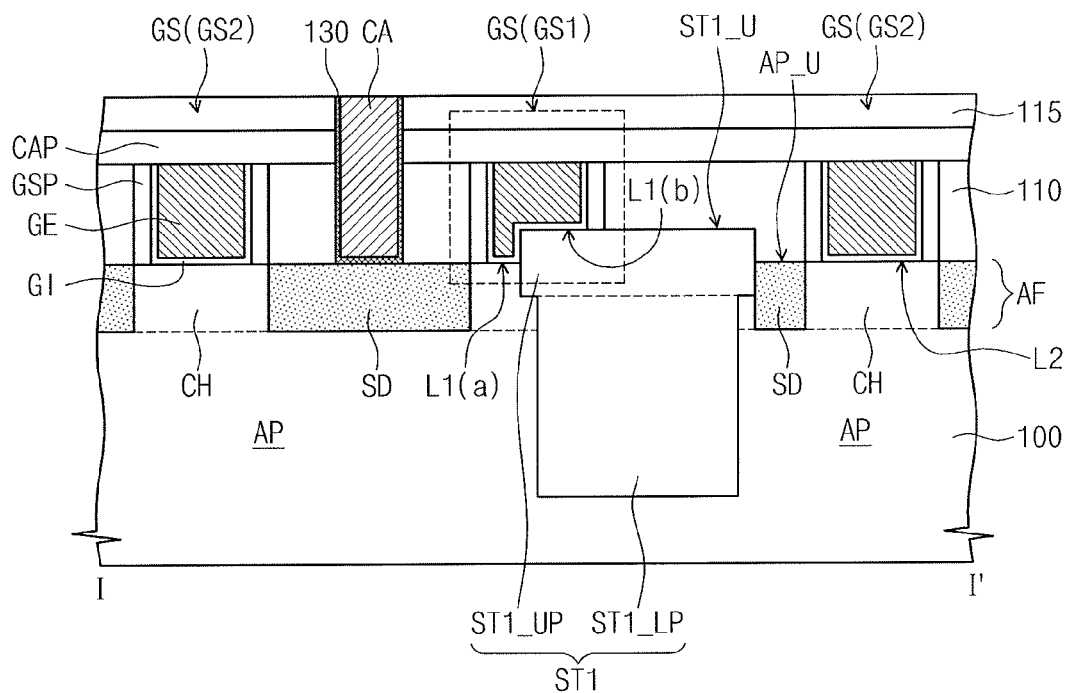
FIGS. 10A and 10B illustrate cross-sectional views along lines I-I' and II-II' of FIG. 1, respectively, in a modified example of the first embodiment.
Figure 10B:
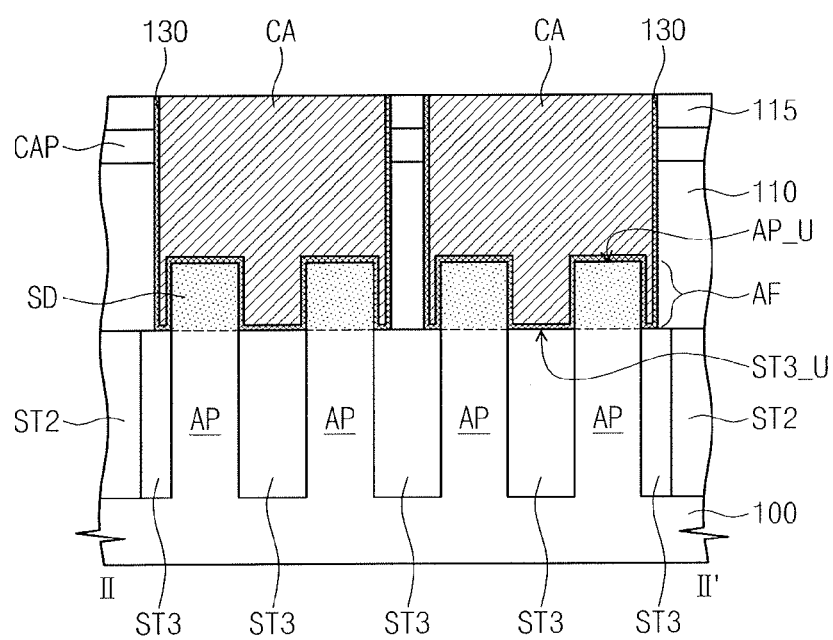

FIG. 9 is a plan view illustrating a semiconductor device in accordance with modified examples of some embodiments. FIGS. 10A and 10B are drawings illustrating a semiconductor device in accordance with a modified example of the first embodiment, and are cross-sectional views taken along the line I-I' and II-II' of FIG. 1, respectively. Hereinafter, for simplicity of description, only differences from the semiconductor device in accordance with the first embodiment described with reference to FIG. 1 and FIGS. 2A and 2B will be described below.

Referring to FIG. 9 and FIGS. 10A and 10B, the gate structures GS may include the first gate structure GS1 and the second gate structure GS2. The first gate structure GS1 may be provided on the first device isolation layer ST1 between the active regions AR. The second gate structure GS2 may be provided on the active regions, and each second gate structure GS2 may cross active patterns AP spaced apart from each other.

According to the modified example embodiments, when viewed from a plan view, the first gate structure GS1 may be disposed to overlap end regions of the active patterns AP spaced apart from each other in the second direction D2 and the first device isolation layer ST1. A first part L1($a$) of a bottom surface of the first gate structure GS1 may be in contact with the end regions of the active patterns AP spaced apart from each other in the direction D2, and a second part L1($b$) of the bottom surface of the first gate structure GS1 may be in contact with the top surface ST1_U of the first device isolation layer ST1.

The top surface ST1_U of the first device isolation layer ST1 may be located at a higher level than a top surface of the active pattern AP. That is, the first part L1($a$) of the bottom surface of the first gate structure GS1 contacting the end regions of the active patterns AP may be located at a lower level than the second part L1 ($b$) of the bottom surface of the first gate structure GS1 contacting the top surface ST1_U of the first device isolation layer ST1. Bottom surfaces L2 of the second gate structures GS2 may be in contact with the top surfaces AP_U of the active patterns AP.

The source/drain regions SD may be provided in the active patterns AP at both sides of each second gate structure GS2. The first gate structure GS1 may be electrically insulated from the adjacent source/drain region SD by the first device isolation layer ST1. In addition, the first gate structure GS1 may include the gate electrode GE extending in the second direction D2 the gate insulating pattern GI extending along the bottom surface of the gate electrode GE. The gate electrode GE of the first gate electrode GS1 may be insulated from the active patterns AP by the gate insulating pattern GI. In the first logic cell C1, the first gate structure GS1 may be a dummy gate structure which does not constitute a transistor.

The first gate structure GS1 may extend on the second logic cell C2. The first gate structure GS1 may extend in the second direction D2 to cross the active patterns AP provided in the second logic cell C2. In the second logic cell C2, the source/drain regions may be provided in the active pattern AP of the both sides of each first gate structure GS1. In the second logic cell C2, a region of the active pattern AP which is located under the first gate structure GS1 and overlaps first gate structure GS1 may be used as a channel region. That is, in the second logic cell C2, the first gate structure GS1 may constitute a transistor.

According to modified example embodiments, the top surface ST1_U of the first device isolation layer ST1 may be located at a higher level than the top surface AP_U of the active pattern AP, and the first gate structure GS1 may be provided on the top surface ST1_U of the first device isolation layer ST1. Thus, in the first logic cell C1, the first gate structure GS1 may be easily insulated from the adjacent source/drain regions SD by the first device isolation layer ST1.

In addition, a volume of the gate electrode GE of the first gate structure GS1 may be increased because the first part L1($a$) of the bottom surface of the first gate structure GS1 is located at a lower level than the second part L1($b$) of the bottom surface of the first gate structure GS1. Accordingly, in the second logic cell C2, a transistor constituted by the first gate structure GS1 may have a variety of characteristics.

Figure 11A:
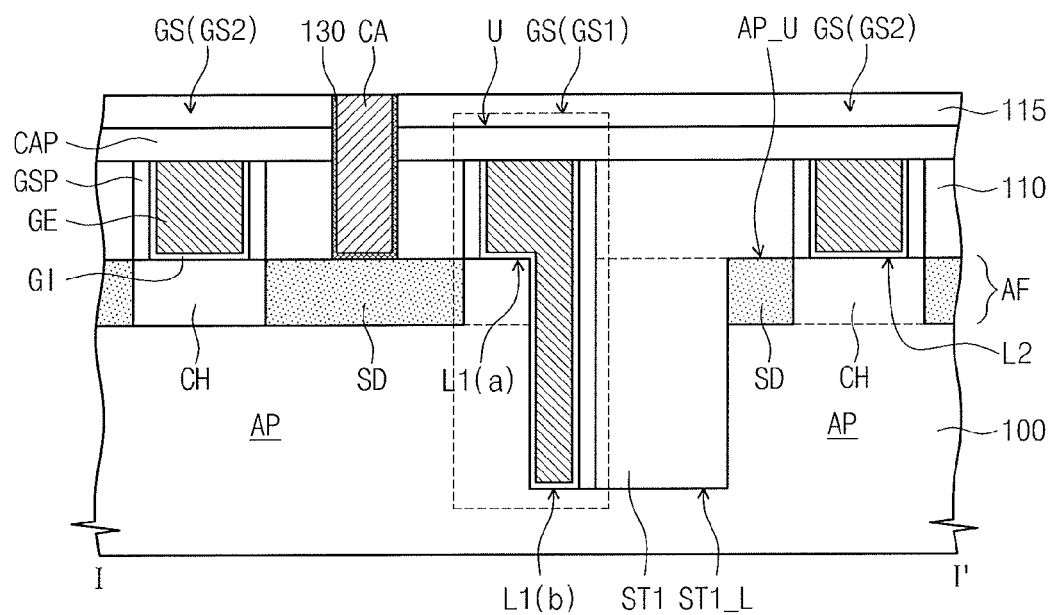
FIGS. 11A and 11B illustrate cross-sectional views along lines I-I' and II-II' of FIG. 9, respectively, in a modified example of the second embodiment.
Figure 11B:
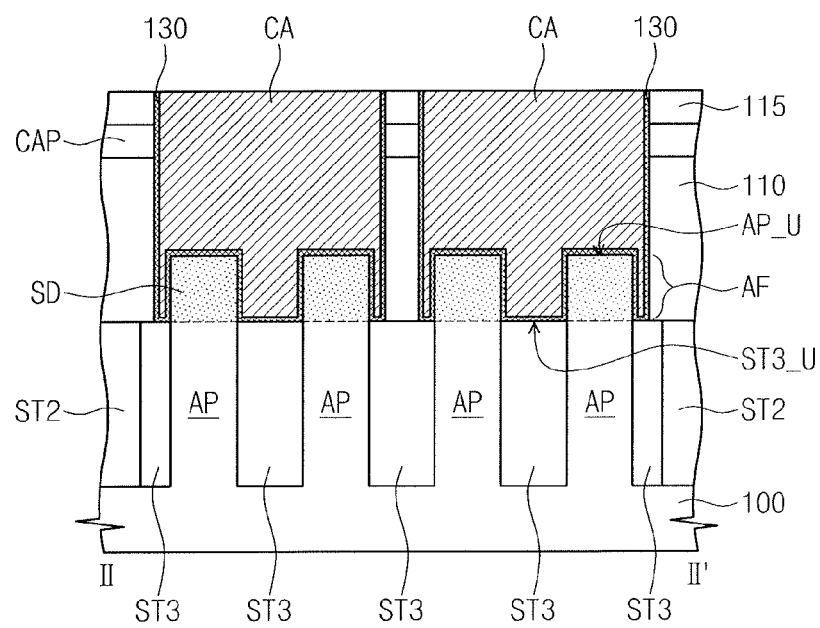

FIGS. 11A and 11B are drawings illustrating a semiconductor device according to a modified example of the second embodiment, and are cross-sectional views taken along lines I-I' and II-II' of FIG. 9, respectively. Hereinafter, for simplicity of description, only differences from the semiconductor device according to the first embodiment described with reference to FIG. 1 and FIGS. 2A and 2B will be described below.

Referring to FIG. 9 and FIGS. 11A and 11B, the gate structures GS may include the first gate structure GS1 penetrating the first device isolation layer ST1 between the active regions AR, and the second gate structure GS2 provided on the active regions AR. Each of the second gate structures GS2 may cross the active patterns AP spaced apart from each other in the second direction D2.

According to the modified example embodiments, when viewed from a plan view, the first gate structure GS1 may be disposed to overlap end regions of the active patterns AP spaced apart from each other in the second direction D2 and the first device isolation layer ST1. A first part L1($a$) of a bottom surface of the first gate structure GS1 may be in contact with the end regions of the active patterns AP spaced apart from each other in the second direction D2, and a second part L1($b$) of the bottom surface of the first gate structure GS1 may be in contact with a bottom surface ST1_L of the first device isolation layer ST1. Thus, The first part L1($a$) of the bottom surface of the first gate structure GS1 contacting the end regions of the active patterns AP may be located at a higher level than the second part L1($b$) of the bottom surface of the first gate structure GS1 contacting the bottom surface ST1_L of the first device isolation layer ST1. A top surface U of the first gate structure GS1 may be located at higher level than the top surface AP_U of the active pattern AP. The bottom surface L2 of the second gate structure GS2 may be in contact with the top surface AP_U of the active pattern AP.

The source/drain regions SD may be provided in the active patterns AP at both sides of each second gate structure GS2. The first gate structure GS1 may be electrically insulated from adjacent source/drain region SD by the first device isolation layer ST1. In addition, the first gate structure GS1 may include a gate electrode GE extending in the second direction D2 and a gate insulating pattern GI extending along a bottom surface of the gate electrode GE, and the gate electrode GE may be electrically insulated from the active patterns AP by the gate insulating pattern GI. In the first logic cell C1, the first gate structure GS1 may be a dummy gate structure which does not constitute a transistor.

The first gate structure GS1 may extend on the second logic cell C2. The first gate structure GS1 extending in the second direction D2 may cross the active pattern AP provided in the second logic cell C2. In the second logic cell C2, source/drain regions SD may be provided in the active patterns AP at both sides of each second gate structure GS1. In the second logic cell C2, a region of active pattern AP which is located under the second gate structure GS1 and overlaps the second gate structure GS1 may be used as a channel region. That is, the first gate structure GS1 provided in the second logic cell C2 may constitute a transistor.

According to the modified example embodiments, in the first logic cell C1, the first gate structure GS1 penetrating the first device isolation ST1 may be easily insulated from the adjacent source/drain regions SD by the first device isolation ST1. In addition, the volume of the gate electrode GE of the first gate structure GS1 may be increased by providing the first gate structure GS1 penetrating the first device isolation layer ST1. Accordingly, in the second logic cell C2, a transistor constituted by the first gate structure GS1 may have a variety of characteristics.

Figure 12:
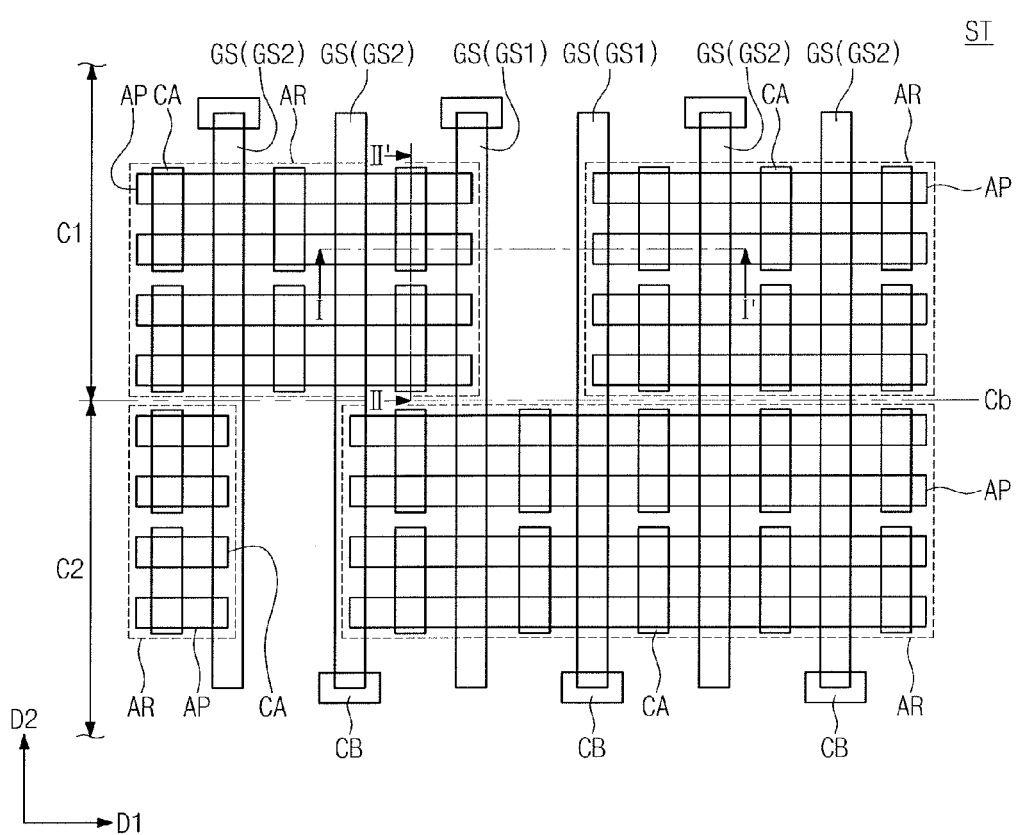
FIG. 12 illustrates a plan view of a semiconductor device according to a third embodiment.
Figure 13B:
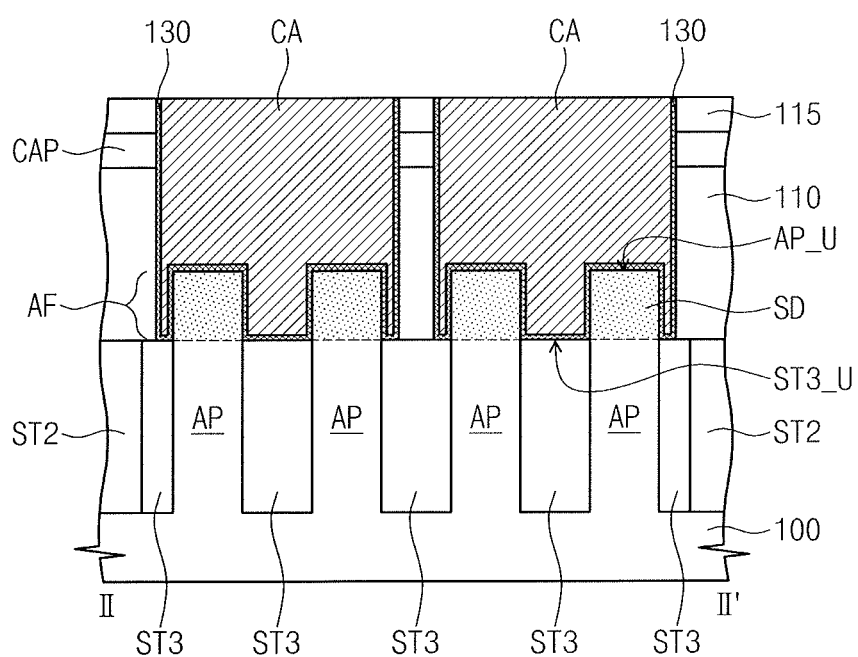

FIG. 12 is a plan view illustrating a semiconductor device according to a third embodiment. FIGS. 13A and 13B are drawings illustrating the semiconductor device according to the third embodiment, and are cross-sectional views taken along lines I-I' and II-II' of FIG. 12, respectively. The same reference numerals are provided to the same constitution as the semiconductor device according to the first embodiment described with reference to FIG. 1 and FIGS. 2A and 2B. The description of common features already discussed above will be omitted.

Referring to FIG. 12 and FIGS. 13A and 13B, a semiconductor device may include the first logic cell C1 and the second logic cell C2 adjacent to the first logic cell C1. The first logic cell C1 may include the active patterns AP separated from each other by the device isolation layer ST. The first logic cell C1 may be separated from the second logic cell C2 by the device isolation layer ST. The cell boundary Cb may be defined between the first logic cell C1 and the second logic cell C2.

The device isolation layer ST may include the first device isolation layer ST1 and the second device isolation layer ST2. The first device isolation layer ST1 may extend in the second direction D2 and separate the active regions AP from each other in the first direction D1. The second device isolation layer ST2 may extend in the first direction D1 and separate the first logic cell C1 from the second logic cell C2 adjacent to the first logic cell C1.

Each of the active regions AR may include a plurality of active patterns AP protruding on the substrate 100. The active patterns AP may extend in the first direction D1 and be spaced apart from each other in the second direction D2. The device isolation layer ST may further include a third device isolation layer ST3 provided on both sides of the active patterns AP. The third device isolation layer ST3 extending in the first direction D1 may be connected to the first device isolation layer ST1.

According to an embodiment, each of the active patterns AP may have an upper region (hereinafter it is referred to as an active fin AF) exposed by the third device isolation layer ST3. That is, a top surface ST3_U of the third device isolation layer ST3 may be located at lower level than a top surface AP_U of the active pattern AP. The top surface of the second device isolation layer ST2 may be substantially coplanar with the top surface ST3_U of the third device isolation layer ST3.

Gate structures GS crossing the active patterns AP and extending in the second direction D2 may be provided on the substrate 100. The gate structures GS may be spaced apart from each other in the first direction D1. Each of the gate structure GS may include the gate electrode GE extending in the second direction D2, the gate insulating pattern GI extending along a bottom surface of the gate electrode GE, the capping pattern CAP extending along a top surface of the gate electrode GE and gate spacers GSP disposed of opposite sidewalls of the gate electrode GE. The gate insulating pattern GI may extend between the gate electrode GE and the gate spacers GSP. The capping pattern CAP extending in the first direction D1 may cover the top surfaces of the plurality of gate electrodes GE.

According to the example embodiment, the gate structures GS may include a pair of gate structures GS1 and second gate structures GS2. Each of the first gate structures GS1 may penetrate the first device isolation layer ST1 between the active regions AR. Each of the second gate structures GS2 may cross the active patterns AP spaced apart from each other in the second direction D2.

Each of the first gate structure GS1 may be disposed to overlap end regions of the active patterns AP and the first device isolation layer ST1. The first part L1(a) of the bottom surface of each of the first gate structure GS1 may be in contact with the end regions of the active patterns AP spaced apart from each other in the second direction D2. The second part L1(b) of the bottom surface of each of the first gate structure GS1 may be in contact with a bottom surface ST1_L of the first device isolation layer ST1. Thus, the first part L1(a) of the bottom surface of each of the first gate structure GS1 may be located at higher level than the second part L1 (b) of the bottom surface of each of the first gate structure GS1. A top surface of each of the first gate structure GS1 may be located at a higher level than the top surfaces AP_U of the active patterns AP. Bottom surfaces L2 of the second gate structures GS2 may be in contact with the top surfaces AP_U of the active patterns AP.

The Source/drain regions SD may be provided in the active patterns AP at both sides of each second gate structure GS2. A region of the active pattern AP which is located under the second gate structure GS2 and overlaps the second gate structure GS2 may be used as a channel region CH.

Each of the first gate structures GS1 may be electrically insulated from adjacent source/drain region SD by the first device isolation layer ST1. In addition, the gate electrode GE of each of the first gate structures GS1 may be electrically insulated from the active patterns AP by the gate insulating pattern GI. In the first logic cell C1, the first gate structures GS1 may be dummy gate structure which does not constitute a transistor.

The first gate structures GS1 may extend on the second logic cell C2. Each of the first gate structures GS1 extending in the second direction D2 may cross the active patterns AP provided in the second logic cell C2. Source/drain regions SD may be provided in or at the active patterns AP of both sides of each first gate structure GS1. A region of the active pattern AP which is located under the first gate structure GS1 and overlaps the first gate structure GS1 may be used as a channel region CH. That is, in the second logic cell C2, each of the first gate structures GS1 may constitute a transistor.

According to the example embodiment, in the first logic cell C1, the active regions AR adjacent to each other may be easily insulated from each other by providing the pair of the first gate structures GS1 which penetrate the first device isolation ST1. In addition, the volume of the gate electrode GE of the first gate structure GS1 may be increased by providing the first gate structure GS1 penetrating the first device isolation layer ST1. Accordingly, in the second logic cell C2, the transistor constituted by the first gate structure GS1 may have various characteristics.

A first interlayer insulating layer 110 covering the gate structure GS may be provided on the substrate 100. The first interlayer insulating layer 110 may be disposed between the gate structures GS, and a top surface of gate electrode GE of each gate structure GS may be substantially coplanar with a top surface of the interlayer insulating layer 110. The capping pattern CAP may extend on the first interlayer insulating layer 110.

According to the example embodiment, the first device isolation layer ST1 may include the same material as the interlayer insulating layer 110. The first device isolation layer ST1 may be connected to the interlayer insulating layer 110 to form a single body.

The second interlayer insulating 115 layer may be provided on the capping pattern CAP. The source/drain contacts CA may penetrate the second interlayer insulating layer 115, the capping pattern CAP, and the first interlayer insulating layer 110 to be electrically connected to the source/drain regions SD. The gate contact CB may be provided on each of the gate structures GS. The gate contact CB may penetrate the second interlayer insulating layer 115 and the capping pattern CAP to be electrically connected to the gate electrode GE. The wiring lines electrically connected to the gate contact CB and the source/drain regions SD may be provided on the substrate 100. The wiring lines may apply voltage to the source/drain regions SD and the gate electrode GE through source/drain contacts CA and the gate contact CB.

Figure 14A:
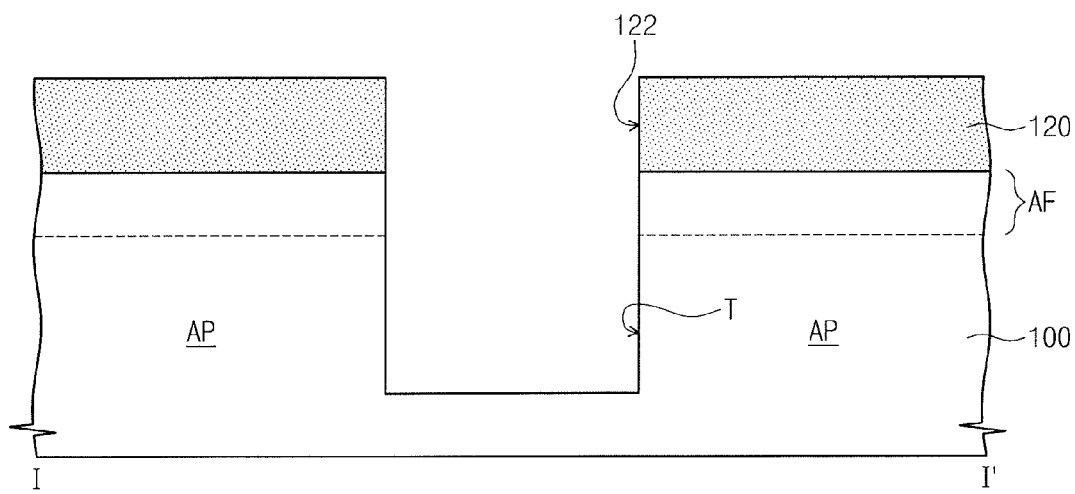
FIGS. 14A and 15A illustrate stages in a method of manufacturing a semiconductor device according to a third embodiment, and are cross-sectional views along line I-I' of FIG. 12.
Figure 14B:
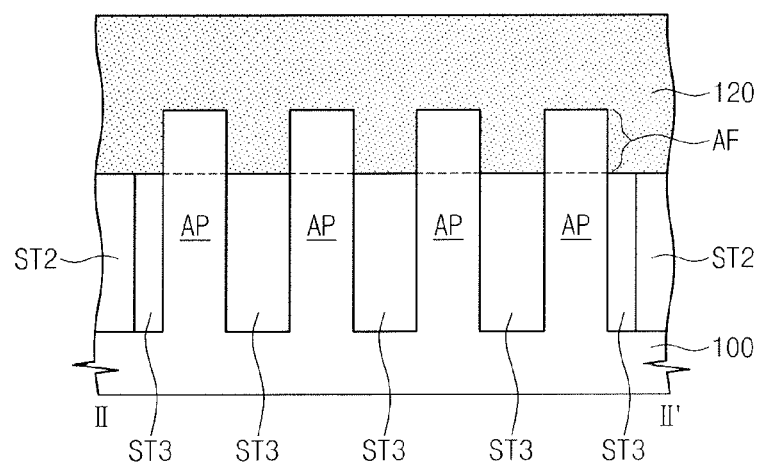
FIGS. 14B and 15B illustrate stages in a method of manufacturing a semiconductor device according to the third embodiment, and are cross-sectional views along line II-II' of FIG. 12.
Figure 15A:
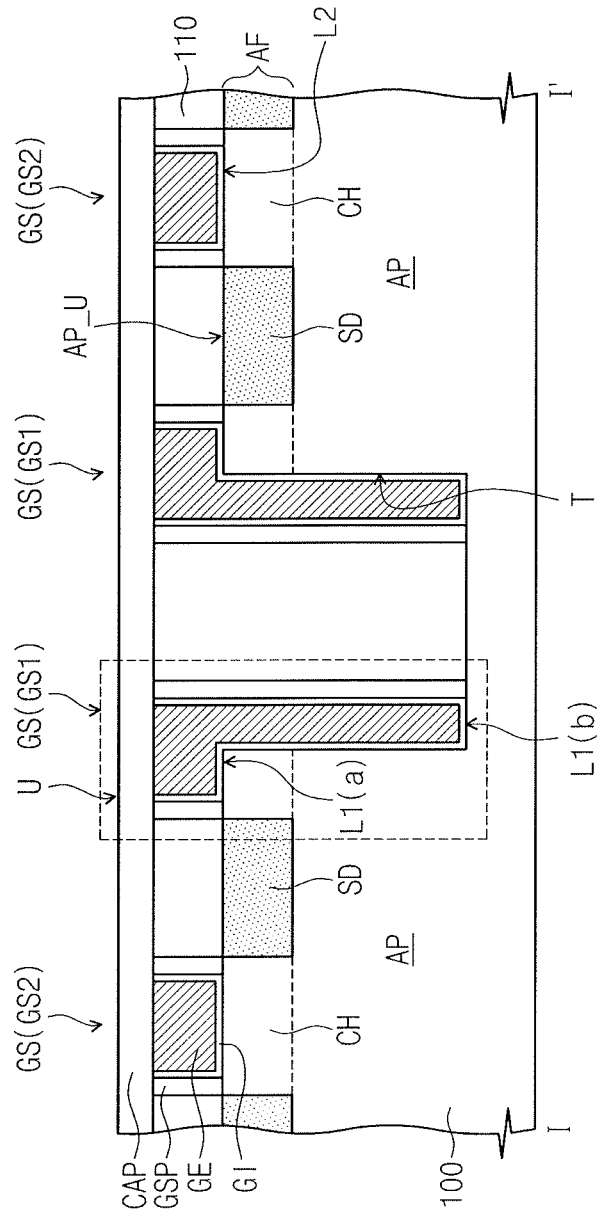
Figure 15B:
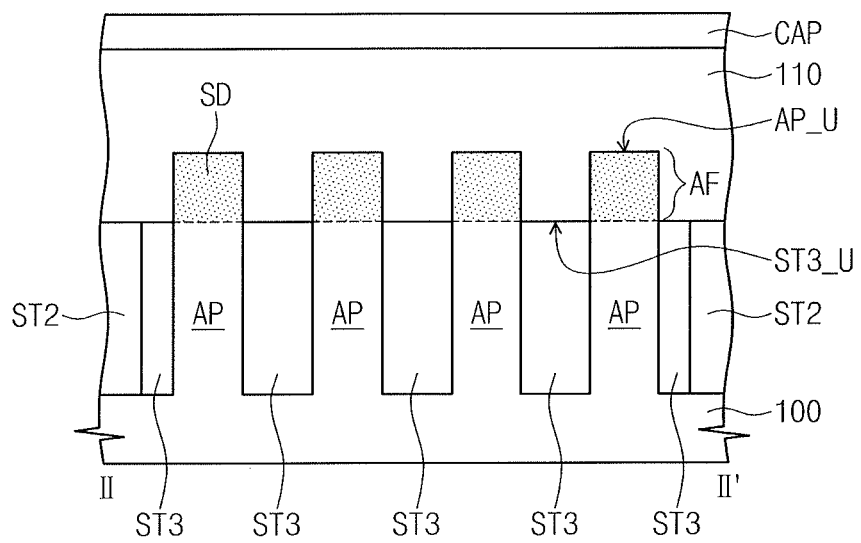

FIGS. 14A and 15A are drawings illustrating a method of manufacturing a semiconductor device according to a third embodiment, and are cross-sectional views taken along the line I-I' of FIG. 12. FIGS. 14B and 15B are drawings illustrating the method of manufacturing the semiconductor device according to the third embodiment, and are cross-sectional views taken along the line II-II' of FIG. 12. The same reference numerals are provided to the same constitution as the method of manufacturing the semiconductor device in accordance with the first embodiment described with reference to FIG. 1, FIGS. 3A through 5A and FIGS. 3B through 5B. The description of common features already described above will be omitted.

Referring to FIG. 12 and FIGS. 14A and 14B, a first preliminary device isolation layer (not shown) and the second device isolation layer ST2 may be formed on the substrate 100. In the first logic cell C1, the first preliminary device isolation layer may extend in the second direction D2 to separate the active regions AR from each other. The active regions AR may be spaced apart from each other in the first direction D1. The second device isolation layer ST2 may extend in the first direction D1 to separate the first logic cell C1 and the second logic cell C2 adjacent to the first logic cell C1. The first preliminary device isolation layer and the second device isolation layer ST2 may be formed by a STI (shallow trench isolation) process. In addition, the third device isolation layer ST3 may be formed on the substrate 100. The third device isolation layers ST3 may extend in the first direction D1 to define active patterns AP in each active region AR. The third device isolation layer ST3 may be formed by the STI (shallow trench isolation) process. The first preliminary device isolation layer, the second device isolation layer ST2, and the third device isolation layer ST3 may be parts of one insulating layer substantially connected to one another. The top surface of the first preliminary device isolation layer, the top surface of the second device isolation layer ST2, and the top surface of the third device isolation ST3 may be substantially coplanar with the top surface of the active pattern AP.

An upper portion of the third device isolation layer ST3 may be etched to expose an upper region of the active pattern AP. The upper region of the active pattern AP exposed by the third device isolation layer ST3 may be defined as the active fin AF. During the etching process, the first preliminary device isolation layer and the second device isolation layer ST2 may be etched. Accordingly, the top surface of the first preliminary device isolation layer and the top surface of the second device isolation layer ST2 may be substantially coplanar with the top surface of the third device isolation layer ST3.

The mask pattern 120 having an opening 122 and exposing the top surface of the first preliminary device isolation layer may be formed on the substrate 100. The mask pattern 120 may include a SOH ((spin on hard-mask) layer. The opening 122 may extend along the top surface of the first preliminary device isolation layer.

The first preliminary device isolation layer may be removed by performing an etching process using the mask pattern 120 as an etching mask. Thus, the trench T exposing the substrate 100 may be formed between the active regions AR. The second and the third device isolation layer ST2, ST3 covered by the mask pattern 120 may not be etched during the etching process.

Referring to FIG. 12 and FIGS. 15A and 15B, the mask pattern 120 may be removed. The mask pattern 120 may be removed using an ashing process and/or a strip process.

After that, the gate structures GS extending in the second direction D2 and being spaced apart from each other in the first direction D1 may be formed on the substrate 100. Forming the gate structures GS may be substantially the same as the method of manufacturing the semiconductor device in accordance with the first embodiment described with reference to FIG. 1, FIG. 5A and FIG. 5B. For example, forming the gate structures GS may include forming sacrificial patterns (not shown) and gate spacers GSP, forming the first interlayer insulating layer 110 covering the sacrificial patterns, planarizing the first insulating layer until the sacrificial gate patterns is exposed, forming gap regions between the gate spacers GSP after removing the sacrificial gate patterns and forming gate insulating patterns GI and gate electrodes GE in the gap regions. After that, a capping pattern CAP covering a top surface of the gate insulating pattern GI, a top surface of the gate electrode GE and a top surface of the gate spacer GSP may be formed on the first interlayer insulating layer 110.

According to the embodiment, the gate structures GS may include a pair of first gate structure GS1 provided in the trench T disposed between the active regions AR and second gate structures GS2 provided on the active regions AR. Each of the second gate structures GS2 may cross the active patterns AP spaced apart from each other in the second direction D2.

Each of the first gate structures GS1 may be formed to overlap end regions of the active patterns AP spaced apart from each other in the second direction D2 and the trench T. A sidewall of each of the first gate structures GS1 may be in contact with an inner sidewall of the trench T. The first gate structures GS1 may be formed to be spaced apart from each other in the trench T. Thus, the first gate structures GS1 may be formed to partially fill the trench T and the first interlayer insulating layer 110 may be formed to fill remainder of the trench T. That is, a part of the first interlayer insulating layer 110 may extend between the first gate structures GS1.

The top surface U of the first gate structure GS1 may be located at a higher level than a top surface of the active pattern AP. The bottom surface L2 of the second gate structure GS2 may be in contact with the top surface AP_U of the active pattern AP.

The source/drain regions SD may be formed in the active patterns AP at both sides of each second gate structure GS2. Forming the source/drain regions SD may be the same as the method of manufacturing the semiconductor device in accordance with the first embodiment described with reference to FIG. 1, FIG. 5A and FIG. 5B.

Referring back to FIG. 12 and FIGS. 13A and 13B, the first interlayer insulating layer 110 may be formed to fill the remainder of the trench T. Thus, the first device isolation layer ST1 separating the active regions AR from each other may be defined between the active regions AR. The device isolation layer ST1 may extend in the second direction D2. Each of the first gate structures GS1 may penetrate the first device isolation layer ST1.

The second interlayer insulating layer 115 may be formed on the capping pattern CAP. The source/drain contacts CA connected to the source/drain regions SD may be formed. The source/drain contacts CA may penetrate the second interlayer insulating layer 115, the capping pattern CAP and the first interlayer insulating layer 110. The gate contact CB connected to the gate electrode GE may be formed on each gate structure GS. The gate contact CB may penetrate the second interlayer insulating layer 115 and the capping pattern CAP. Forming the source/drain contacts CA and the gate contact CB may be the same as the method of manufacturing the semiconductor device in accordance with the first embodiment described with reference to FIG. 1 and FIGS. 2A and 2B.

The wiring lines may be formed on the substrate 100. The wiring lines may electrically connect the source/drain contacts CA and the gate contacts CB. The wiring lines may be applied a voltage to the source/drain regions SD and the gate electrodes GE through the source/drain contacts CA and the gate contacts CB, respectively.

Figure 16:
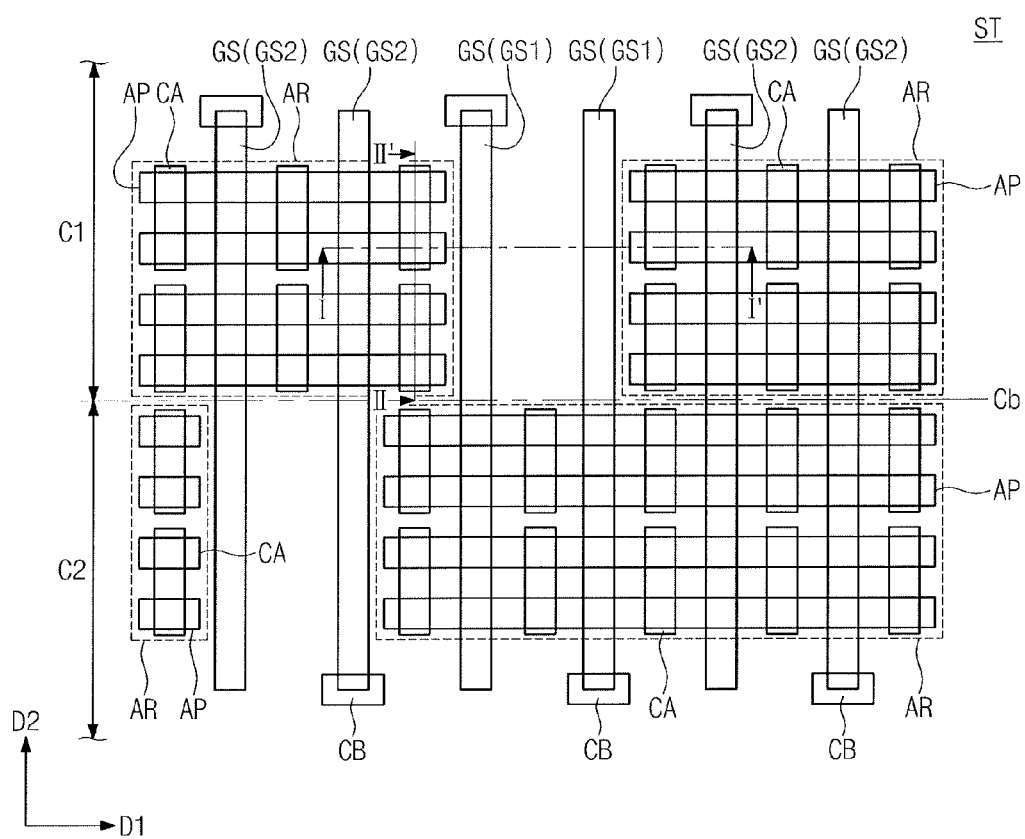
FIG. 16 illustrates a plan of a semiconductor device according to a fourth embodiment.
Figure 17A:
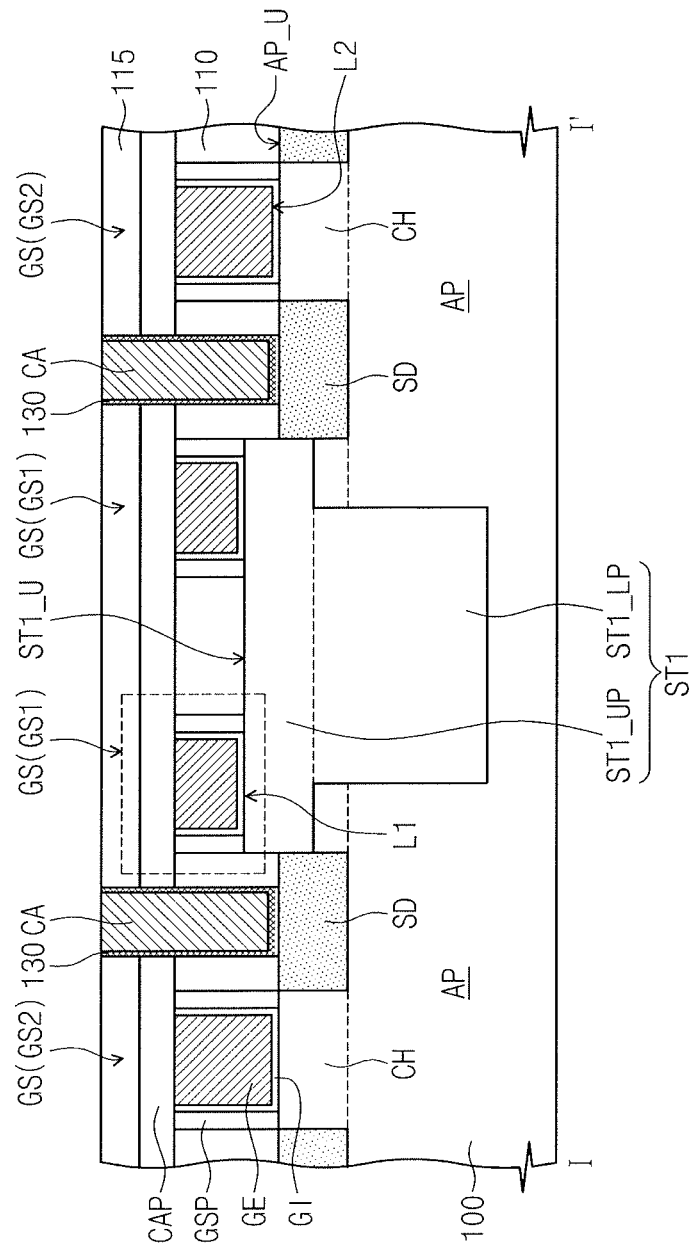
FIGS. 17A and 17B illustrate cross-sectional views along lines I-I' and II-II' of FIG. 16, respectively.
Figure 17B:
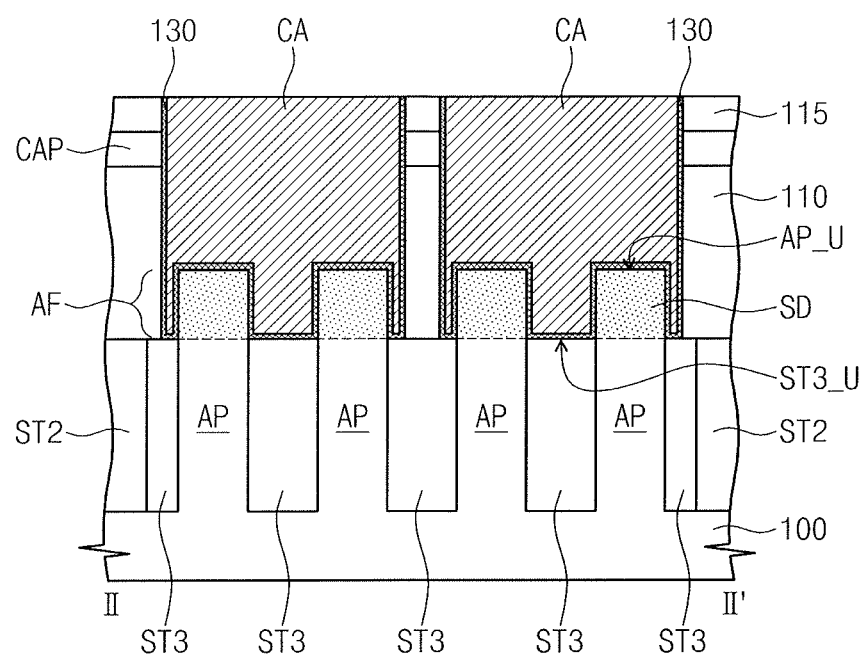

FIG. 16 is a plan view illustrating a semiconductor device according to a fourth embodiment. FIGS. 17A and 17B are cross-sectional views taken along lines I-I' and II-II' of FIG. 16, respectively. The same reference numerals are provided to the same constitution as the semiconductor device according to the first embodiment described with reference to FIG. 1 and FIGS. 2A and 2B. The description of common features already discussed above will be omitted.

Referring to FIG. 16 and FIGS. 17A and 17B, a semiconductor device may include the first logic cell C1 and the second logic cell C2 adjacent to the first logic cell C1. The first logic cell C1 may include the active patterns AP separated from each other by the device isolation layer ST. The first logic cell C1 may be separated from the second logic cell C2 by the device isolation layer ST. The cell boundary Cb may be defined between the first logic cell C1 and the second logic cell C2.

The device isolation layer ST may include the first device isolation layer ST1 the second device isolation layer ST2. The first device isolation layer ST1 may extend in the second direction D2 and separate the active regions AP from each other in the first direction D1. The second device isolation layer ST2 may extend in the first direction D1 and separate the first logic cell C1 from the second logic cell C2 adjacent to the first logic cell C1.

Each of the active regions AR may include a plurality of active patterns AP protruding on the substrate 100. The active patterns AP may extend in the first direction D1 and be spaced apart from each other in the second direction D2. The device isolation layer ST may further include the third device isolation layer ST3 provided on both sides of the active patterns AP. The third device isolation layer ST3 extending in the first direction D1 may be connected to the first device isolation layer ST1.

According to an embodiment, each of the active patterns AP may have an upper region (hereinafter it is referred to as an active fin AF) exposed by the third device isolation layer ST3. That is, the top surface ST3_U of the third device isolation layer ST3 may be located at a lower level than the top surface AP_U of the active pattern AP. The top surface of the second device isolation layer ST2 may be substantially coplanar with the top surface ST3_U of the third device isolation layer ST3.

According to the embodiment, the first device isolation layer ST1 may have a width along a direction parallel to a top surface of the substrate 100. The width of an upper portion ST1_UP of the first device isolation layer ST1 may be greater than the width of a bottom portion ST1_LP of the first device isolation layer ST1. The top surface ST1_U of the first device isolation layer ST1 may be located at higher level than the top surfaces AP_U of the active patterns AP.

The gate structures GS extending in the second direction D2 and being spaced apart from each other in the first direction D1 may be provided on the substrate 100. Each of the gate structure GS may include the gate electrode GE extending in the second direction D2, the gate insulating pattern GI extending along the bottom surface of the gate electrode GE, the capping pattern CAP extending along the top surface of the gate electrode GE, and gate the spacers GSP disposed of opposite sidewalls of the gate electrode GE. The gate insulating pattern GI may extend between the gate electrode GE and the gate spacers GSP. The capping pattern CAP extending in the first direction D1 may cover the top surfaces of the plurality of gate electrodes GE.

According to the embodiment, the gate structures GS may include a pair of gate structures GS1 and second gate structures GS2. The pair of first gate structures GS1 may be disposed on the first device isolation layer ST1. The second gate structures GS2 may be disposed on the active regions AR. Each of the first gate structures GS1 disposed on the first device isolation layer ST1 may be spaced apart from the active patterns AP. Each of the second gate structures GS2 may cross the active patterns AP spaced apart from each other in the second direction D2.

A bottom surface L1 of each of the first gate structure GS1 may be in contact with the top surface ST1_U of the first device isolation layer ST1. That is, the gate insulating pattern GI of each first gate structure GS1 may be in contact with the top surface ST1_U of the first device isolation layer ST1. Thus, the bottom surface L1 of each of the first gate structure GS1 may be located at a higher level than the top surfaces AP_U of the active patterns AP. The bottom surfaces L2 of the second gate structures GS2 may be in contact with the top surfaces AP_U of the active patterns AP.

The source/drain regions SD may be provided in the active patterns AP at both sides of each second gate structure GS2. A region of the active pattern AP which is located under the second gate structure GS2 and overlaps the second gate structure GS2 may be used as a channel region CH.

Each of the first gate structures GS1 may be electrically insulated from adjacent source/drain region SD by the first device isolation layer ST1. That is, in the first logic cell C1, the first gate structures GS1 may be dummy gate structure which does not constitute a transistor.

The first gate structures GS1 may extend on the second logic cell C2. Each of the first gate structures GS1 extending in the second direction D2 may cross the active patterns AP provided in the second logic cell C2. Source/drain regions SD may be provided in or at the active patterns AP of both sides of each first gate structure GS1. A region of the active pattern AP which is located under the first gate structure GS1 and overlaps the first gate structure GS1 may be used as a channel region CH. That is, in the second logic cell C2, each of the first gate structures GS1 may constitute a transistor.

According to the embodiment, the top surface ST1_U of the first device isolation layer may be located at higher level than the top surfaces AP_U of the active patterns AP, and the pair of first gate structures GS1 may be provided on the top surface ST1_U of the first device isolation layer ST1. Thus, the active patterns adjacent to each other may be easily insulated from each other in the first logic cell C1.

The first interlayer insulating layer 110 covering the gate structure GS may be provided on the substrate 100. The first interlayer insulating layer 110 may be disposed between the gate structures GS, and a top surface of gate electrode GE of each gate structure GS may be substantially coplanar with a top surface of the interlayer insulating layer 110. The capping pattern CAP may extend on the first interlayer insulating layer 110. The second interlayer insulating 115 layer may be provided on the capping pattern CAP. Source/drain contacts CA may penetrate the second interlayer insulating layer 115, the capping pattern CAP and the first interlayer insulating layer 110 to be electrically connected to the source/drain regions SD. A gate contact CB may be provided on each of the gate structures GS. The gate contact CB may penetrate the second interlayer insulating layer 115 and the capping pattern CAP to be electrically connected to the gate electrode GE. Wiring lines (not shown) electrically connected to the gate contact CB and the source/drain regions SD may be provided on the substrate 100. The wiring lines may apply a voltage to source/drain regions SD and the gate electrode GE through source/drain contacts CA and the gate contact CB.

A method of manufacturing the semiconductor device according to the fourth embodiment, unlike those illustrated in FIG. 1 and FIG. 5A, may be substantially the same as the method of manufacturing the semiconductor device according to the first embodiment described with reference to FIG. 1, FIGS. 3A through 5A and FIGS. 3B through 5B, except forming the pair of gate structures GS1.

According to embodiments, a semiconductor device may include a first logic cell and a second logic cell adjacent to each other, so at least one of the gate structures, e.g., continuously, crosses both the first logic cell and the second logic cell. The at least one of the gate structures may be a dummy gate structure which does not constitute a transistor in the first logic cell, and may constitute a transistor in the second logic cell. In the first logic cell, the active regions adjacent to each other may be easily insulated from each other by providing at least one of the gate structures on the device isolation. Further, as the position of the gate electrode of the gate structure relative to the device isolation may facilitate increase of the gate electrode volume, in the second logic cell, various characteristics of a transistor constituted by the gate structure may be improved. Accordingly, a semiconductor device having a good reliability and various characteristics, and a method of manufacturing the same may be provided. It is noted that while the active patterns are illustrated to have a fin shape, various modifications are possible.

Figure 18:
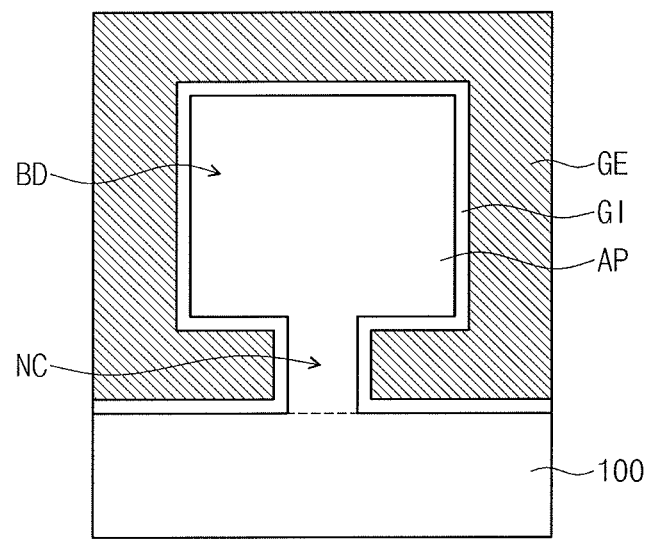
FIG. 18 illustrates a conceptual view of an active pattern of a semiconductor device in accordance with some embodiments.

FIG. 18 is a conceptual view illustrating an active pattern of a semiconductor device in accordance with some embodiments. A cross section of the active pattern AP may have an omega shape including a neck part NC adjacent to the substrate 100 and the body part BD wider than the neck part NC. The gate insulating pattern GI and the gate electrode GE may be sequentially provided on the active pattern AP. A part of the gate electrode GE may extend below the active pattern AP.

Figure 19:
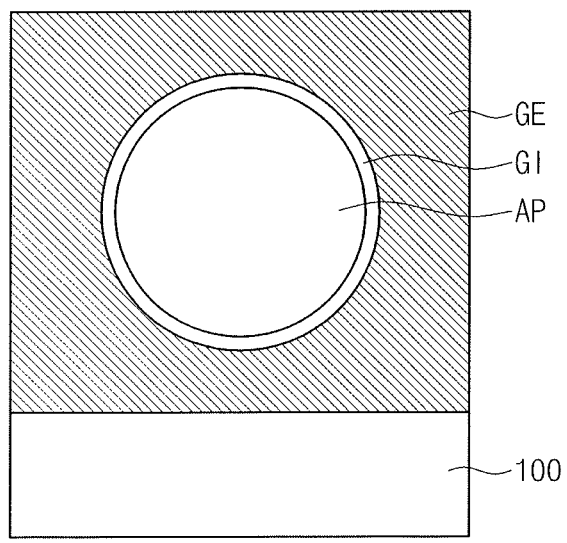
FIG. 19 illustrates a conceptual view of an active pattern of a semiconductor device in accordance with other embodiments.

FIG. 19 is a conceptual view illustrating an active pattern of a semiconductor device in accordance with other embodiments. The active pattern AP of the semiconductor device may have a nano wire shape spaced apart from the substrate 100. The gate insulating pattern GI and the gate electrode GE may be sequentially provided on the active pattern AP. The gate electrode GE may extend between the active pattern AP and the substrate 100.

Figure 20:
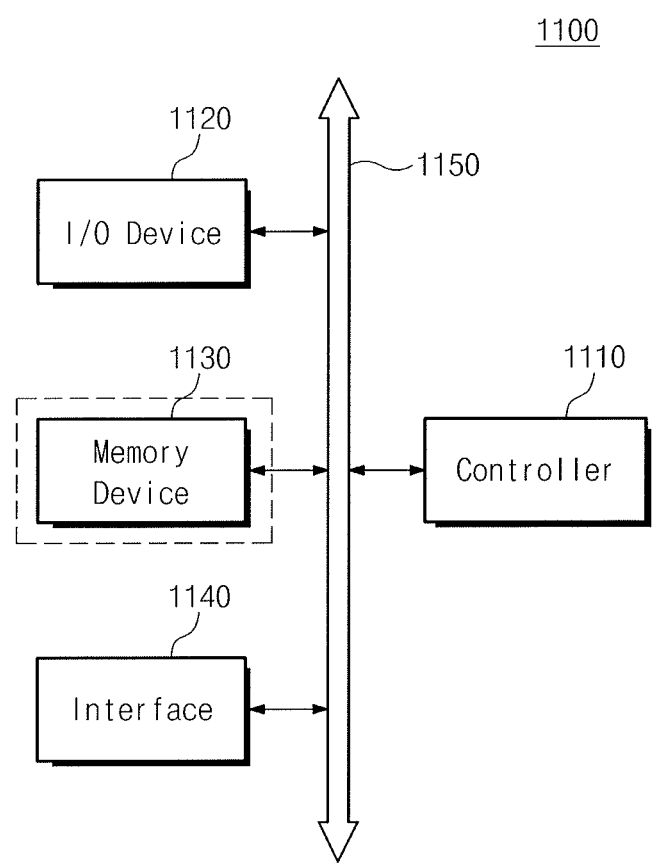
FIG. 20 illustrates a block diagram of an electronic system including a semiconductor device in accordance with some embodiments.

FIG. 20 is a block diagram of an electronic system including a semiconductor device in accordance with some embodiments.

Referring to FIG. 20, the electronic system 1100 may include a controller 1110, an input/output device 1120, a memory device 1130, an interface 1140 and a bus 1150. The controller 1110, the input/output device 1120, the memory device 1130, and/or the interface 1140 can combine with one another through the bus 1150. The bus 1150 is a path through which data moves.

The controller 1110 may include at least one of, e.g., a microprocessor, a digital signal process, a micro controller, and logical devices that can perform functions similar thereto. The input/output device 1120 may include, e.g., a keypad, a keyboard, and a display device. The memory device 1130 can store data and/or commands. The memory device 1130 may include a nonvolatile memory device, e.g., a flash memory device, a phase change memory device, and/or a magnetic memory device. In addition, the memory device 1130 may further include a volatile memory device. In this case, the memory device 1130 may include a SRAM (Static Random Access Memory) device having the semiconductor devices in accordance with some embodiments. The interface 1140 can perform a function of transmitting data to a communication network or receiving data from a communication network. The interface 1140 may have a wired or wireless form. For instance, the interface 1140 may include an antenna or a wired/wireless transceiver. The semiconductor device in accordance with some embodiments may be provided as a part of the controller 1110 and input/output device 1120. Although not illustrated, the electronic system 1100 may further include a high speed DRAM (Dynamic Random Access Memory) and/or SRAM as an operation memory for improving an operation of the controller 1110.

Figure 21:
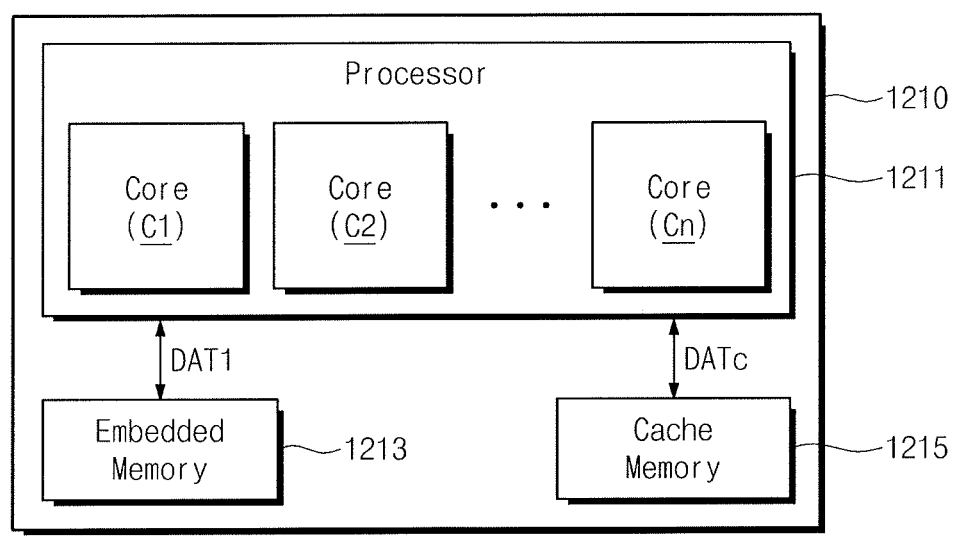
FIG. 21 illustrates a block diagram showing a configuration of an electronic device including a semiconductor device in accordance with some embodiments.

FIG. 21 is a block diagram showing a configuration of an electronic device including a semiconductor device in accordance with some embodiments.

Referring to FIG. 21, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may process a data and a signal. The processor cores C1-Cn may include a semiconductor device in accordance with embodiments e.g., logic cells illustrated with reference to FIG. 1. The electronic device 1200 may perform a specific function using the processing data and the signal. The processor 1211 may be an application processor.

The embedded memory 1213 may exchange a first data DATA1 with the processor 1211. The first data DATA1 may be the data being processed or to be processed by the one or more processor cores C1-Cn. The embedded memory 1213 may manage the first data DATA1. For example, the embedded memory 1213 may buffer the first data DATA1. That is, the embedded memory 1213 may operate as a buffer memory or a working memory of the processor 1211. According to an, the electronic device 1200 may be applied to a wearable device.

The embedded memory 1213 may be, e.g., a SRAM. The SRAM may operate at a faster speed than a DRAM. When the SRAM is embedded in the semiconductor chip 1210, the electronic device 1200 may have a small size and may operate at a high speed. The SRAM may include the semiconductor device according to embodiments.

The cache memory 1215 with the one or more processor cores C1 through Cn may be mounted on the semiconductor chip 1210. The cache memory 1215 may storage a cache data DATc. The cache data DATc may be a data using the one or more processor cores C1 through Cn. The cache memory 1215 may include SRAM including the semiconductor device according to embodiments.

For ease of understanding, in FIG. 21, the cache memory 1215 is shown as a separate component. However, the processor 1211 may be configured to include the cache memory 1215. It is noted that FIG. 21 is not limited the scope illustrated therein.

The processor 1211, the embedded memory 1213, and the cache memory 1215 may transmit a data based on a variety of interface protocols. For example, the processor 1211, the embedded memory 1213 and the cache memory 1215 may transmit the data based on at least one of USB (Universal Serial Bus), SCSI (Small Computer System Interface), PCI (Peripheral Component Interconnect) Express, ATA (Advanced Technology Attachment), PATA (Parallel ATA), SATA (Serial ATA), SAS(Serial Attached SCSI), IDE (Integrated Drive Electronics), UFS (Universal Flash Storage).

Figure 22:
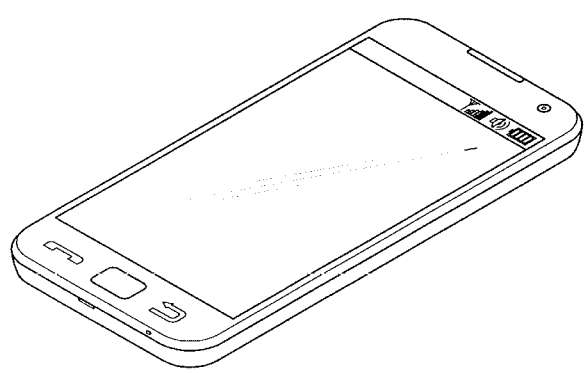
FIGS. 22 through 24 illustrate multimedia devices including semiconductor devices according to embodiments.
Figure 23:
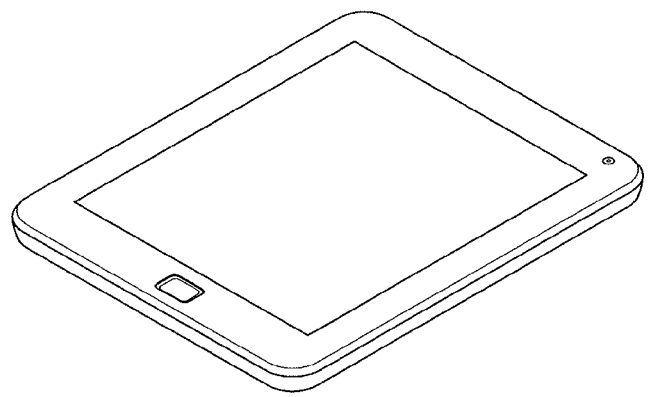
Figure 24:
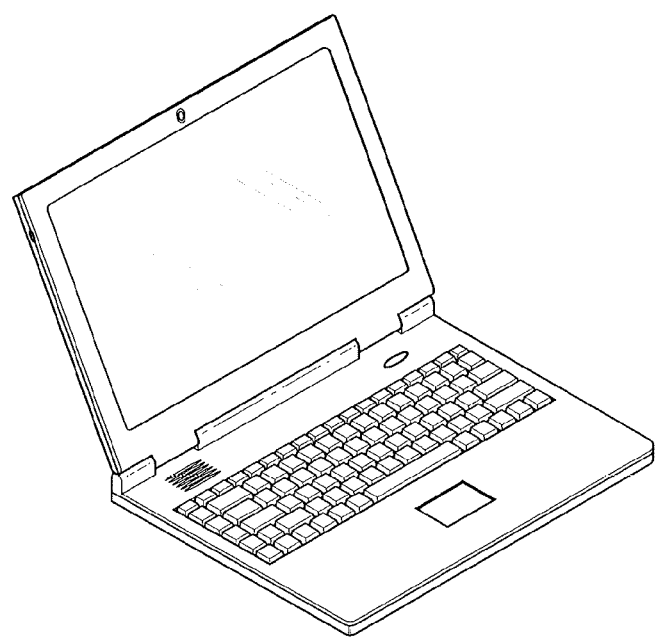

FIGS. 22 through 24 are drawings illustrating multimedia devices including semiconductor devices according to embodiments. The electronic system 1100 of FIG. 20 and/or the electronic device 1200 of FIG. 21 may be applied to a mobile phone or a smart phone 2000 shown in FIG. 22, may be applied to a tablet or a smart tablet 3000 shown in FIG. 23, and may be applied to a notebook computer 4000 shown in FIG. 24.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a first device isolation layer between active regions spaced apart from each other in a first direction on a substrate;
second device isolation layers between active patterns protruding from the substrate in each active region, the second device isolation layers extending in the first direction and being spaced apart from each other in a second direction crossing the first direction, and each of the second device isolation layers being connected to the first device isolation layer; and a gate structure extending in the second direction and penetrating the first device isolation layer between the active regions, wherein at least a part of a bottom surface of the gate structure contacts a bottom surface of the first device isolation layer.

2. The semiconductor device as claimed in claim 1, further comprising a first logic cell and a second logic cell adjacent to each other in the second direction, wherein the first device isolation layer is between the active regions in the first logic cell, and wherein the gate structure extends in the second direction to cross at least one active pattern of the second logic cell.

3. The semiconductor device as claimed in claim 1, wherein a first part of the bottom surface of the gate structure contacts end portions of the active patterns spaced apart from each other in the second direction, and a second part of the bottom surface of the gate structure contacts the bottom surface of the first device isolation layer.

4. The semiconductor device as claimed in claim 1, wherein the gate structure is spaced apart from the active patterns, and the bottom surface of the gate structure contacts the bottom surface of the first device isolation layer.

5. The semiconductor device as claimed in claim 1, wherein a top surface of the gate structure is at a higher level than topmost surfaces of the active patterns.

6. The semiconductor device as claimed in claim 5, wherein a top surface of the second device isolation layer is at a lower level than the topmost surfaces of the active patterns.

7. The semiconductor device as claimed in claim 1, wherein the gate structure includes a gate electrode extending in the second direction and a gate insulating pattern extending along a bottom surface of the gate electrode, the gate electrode including a conductive material.

8. The semiconductor device as claimed in claim 7, wherein at least a part of a bottommost surface of the gate insulating pattern contacts the bottom surface of the first device isolation layer.

9. The semiconductor device as claimed in claim 1, wherein the gate structure is a first gate structure, and further comprising second gate structures extending in the second direction on the active regions, each of the second gate structures crossing the active patterns spaced apart from each other.

10. The semiconductor device as claimed in claim 9, further comprising source/drain regions in the active patterns at opposite sides of each of the second gate structures, the first gate structure being electrically insulated from adjacent source/drain regions by the first device isolation layer.

11. A semiconductor device, comprising:

a first device isolation layer between active regions spaced apart from each other along a first direction on a substrate;

second device isolation layers between a plurality of active patterns protruding from the substrate in each active region, the second device isolation layers extending in the first direction and being spaced apart from each other in a second direction crossing the first direction, and each of the second device isolation layers connected to the first device isolation layer; and a gate structure extending in the second direction on the first device isolation layer between the active regions, wherein a top surface of the second device isolation layer is at a lower level than a topmost surface of the active pattern, and a top surface of the first device isolation layer is at a higher level than the topmost surface of the active pattern, and wherein at least a part of a bottom surface of the gate structure is at a higher level than the topmost surface of the active pattern.

12. The semiconductor device as claimed in claim 11, wherein a first part of the bottom surface of the gate structure contacts end portions of the active patterns spaced apart from each other in the second direction, and a second part of the bottom surface of the gate structure contacts the top surface of the first device isolation layer.

13. The semiconductor device as claimed in claim 11, wherein the gate structure is spaced apart from the active patterns along the first direction to have a non-overlapping relationship with the active patterns, and the bottom surface of the gate structure contacts the top surface of the first device isolation layer.

14. The semiconductor device as claimed in claim 11, wherein at least the part of the bottom surface of the gate structure contacts the top surface of the first device isolation layer.

15. The semiconductor device as claimed in claim 11, wherein:

the gate structure includes a gate electrode extending in the second direction and a gate insulating pattern extending along a bottom surface of the gate electrode, and the gate electrode includes a conductive material, at least a portion of the first device isolation layer extending between and to a higher height than two adjacent active patterns of two different active regions, respectively, and in contact with the gate structure.

16. The semiconductor device as claimed in claim 15, wherein at least a part of a bottom surface of the gate insulating pattern contacts the top surface of the first device isolation layer.

17. The semiconductor device as claimed in claim 11, wherein the gate structure is a first gate structure, and further comprising second gate structures extending in the second direction on the active regions, the second gate structures crossing the active patterns and being spaced apart from each other.

18. The semiconductor device as claimed in claim 17, further comprising source/drain regions in the active patterns at opposite sides of each of the second gate structures, the first gate structure being electrically insulated from adjacent source/drain regions by the first device isolation layer.

19. The semiconductor device as claimed in claim 11, further comprising a first logic cell and a second logic cell adjacent to each other in the second direction, wherein the first device isolation layer is between the active regions in the first logic cell, and wherein the gate structure extends in the second direction to cross at least one active pattern of the second logic cell.

20. The semiconductor device as claimed in claim 19, further comprising source/drain region in a first part of the at least one active pattern of the second logic cell at opposite sides of the gate structure, wherein a second part of the at least one active pattern under the gate structure in the second logic cell is a channel region.

21. A semiconductor device, comprising:
a first device isolation layer extending in a second direction and defining active regions spaced apart from each other along a first direction on a substrate;
second device isolation layers defining a plurality of active patterns protruding from the substrate in each active region, the second device isolation layers extending in the first direction to be spaced apart from each other in the second direction crossing the first direction, the second device isolation layer being perpendicular to and connected to the first device isolation layer; and
a gate structure extending in the second direction on the first device isolation layer between the active regions,
wherein top surfaces of the first and second device isolation layers are at different heights, a top surface of the second device isolation layer being at a lower level than a topmost surface of the active pattern, and a top surface of the first device isolation layer being at a higher level than the topmost surface of the active pattern, and wherein at least a part of a bottom surface of the gate structure is at a higher level than the topmost surface of the active pattern.

22. The semiconductor device as claimed in claim 21, wherein at least a part of the bottom surface of the gate structure contacts the bottom surface of the first device isolation layer.

23. The semiconductor device as claimed in claim 21, wherein a bottom surface of the first device isolation layer is wider than a bottom surface of the gate structure, at least a portion of the first device isolation layer separating the bottom surface of the gate structure from an adjacent active pattern.

24. The semiconductor device as claimed in claim 23, wherein at least the part of the bottom surface of the gate structure directly contacts an uppermost surface of the first device isolation layer.

25. The semiconductor device as claimed in claim 24, wherein the uppermost surface of the first device isolation layer is wider than the bottom surface of the first device isolation layer.

* * * * *